(12) United States Patent
Kataya et al.

(10) Patent No.: US 8,400,307 B2
(45) Date of Patent: Mar. 19, 2013

(54) RADIO FREQUENCY IC DEVICE AND ELECTRONIC APPARATUS

(75) Inventors: Takeshi Kataya, Ritto (JP); Noboru Kato, Moriyama (JP); Satoshi Ishino, Kusatsu (JP); Nobuo Ikemoto, Moriyama (JP); Ikuhei Kimura, Nara (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/959,454

(22) Filed: Dec. 3, 2010

(65) Prior Publication Data

US 2011/0074584 A1    Mar. 31, 2011

Related U.S. Application Data

(63) Continuation of application No. 12/235,753, filed on Sep. 23, 2008, now abandoned, which is a continuation-in-part of application No. 11/851,661, filed on Sep. 7, 2007, now Pat. No. 7,830,311, and a continuation of application No. PCT/JP2008/052129, filed on Feb. 8, 2008, and a continuation of application No. PCT/JP2008/055962, filed on Mar. 27, 2008.

(30) Foreign Application Priority Data

Jul. 18, 2007    (JP) .................................. 2007-186392

(51) Int. Cl.
    *G08B 13/14*    (2006.01)
    *H04Q 5/22*    (2006.01)
    *H01L 27/08*    (2006.01)
    *H01Q 1/38*    (2006.01)
    *H01Q 21/00*    (2006.01)

(52) U.S. Cl. ............... 340/572.8; 340/572.1; 340/572.7; 340/10.1; 343/700 MS; 343/770; 343/726; 343/853; 343/867; 257/531

(58) Field of Classification Search .................. None
See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |

(Continued)

FOREIGN PATENT DOCUMENTS

| | | |
|---|---|---|
| DE | 10 2006 057 369 A1 | 6/2008 |
| EP | 0 694 874 A2 | 1/1996 |

(Continued)

OTHER PUBLICATIONS

Official Communication issued in International Application No. PCT/JP2007/066007, mailed on Nov. 27, 2007.

(Continued)

*Primary Examiner* — Jennifer Mehmood
*Assistant Examiner* — Fekadeselassie Girma
(74) *Attorney, Agent, or Firm* — Keating & Bennett, LLP

(57) ABSTRACT

A radio frequency IC device includes a radio frequency IC chip arranged to process a transmitted/received signal, a printed circuit board on which the radio frequency IC chip is mounted, an electrode arrange on the circuit board, and a loop electrode that is arranged on the circuit board so that the loop electrode is electrically connected to the radio frequency IC chip and is coupled to the electrode by electromagnetic coupling. The electrode is coupled to the radio frequency IC chip via the loop electrode so as to transmit or receive a high-frequency signal. A power supply circuit board including a resonance circuit and/or a matching circuit may be disposed between the radio frequency IC chip and the loop electrode.

16 Claims, 15 Drawing Sheets

U.S. PATENT DOCUMENTS

| | | | |
|---|---|---|---|
| 5,399,060 A | 3/1995 | Richert | |
| 5,483,249 A * | 1/1996 | Kennedy | 343/846 |
| 5,491,483 A | 2/1996 | D'Hont | |
| 5,528,222 A | 6/1996 | Moskowitz et al. | |
| 5,614,915 A * | 3/1997 | Webb | 343/770 |
| 5,710,458 A * | 1/1998 | Iwasaki | 257/679 |
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A * | 11/1999 | Walsh | 340/572.7 |
| 6,104,311 A | 8/2000 | Lastinger | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,861,731 B2 | 3/2005 | Buijsman et al. | |
| 6,885,354 B2 * | 4/2005 | Takei | 343/870 |
| 6,927,738 B2 | 8/2005 | Senba et al. | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0067316 A1 | 6/2002 | Yokoshima et al. | |
| 2002/0093457 A1 | 7/2002 | Hamada et al. | |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0052826 A1 * | 3/2003 | Kralovec et al. | 343/700 MS |
| 2003/0169153 A1 | 9/2003 | Muller | |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 * | 1/2006 | Sakama et al. | 257/678 |
| 2006/0028378 A1 * | 2/2006 | Gaucher et al. | 343/700 MS |
| 2006/0044192 A1 | 3/2006 | Egbert | |
| 2006/0044769 A1 * | 3/2006 | Forster et al. | 361/760 |
| 2006/0050491 A1 * | 3/2006 | Hayashi et al. | 361/760 |
| 2006/0054710 A1 * | 3/2006 | Forster et al. | 235/492 |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0208899 A1 * | 9/2006 | Suzuki et al. | 340/572.7 |
| 2006/0214801 A1 | 9/2006 | Murofushi et al. | |
| 2006/0220871 A1 | 10/2006 | Baba et al. | |
| 2006/0244676 A1 | 11/2006 | Uesaka | |
| 2006/0266435 A1 * | 11/2006 | Yang et al. | 148/105 |
| 2006/0267138 A1 * | 11/2006 | Kobayashi | 257/531 |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0126586 A1 | 6/2007 | Ohtaka | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0229279 A1 * | 10/2007 | Yamazaki et al. | 340/572.7 |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0087990 A1 | 4/2008 | Kato et al. | |
| 2008/0169905 A1 | 7/2008 | Slatter | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0065594 A1 | 3/2009 | Kato et al. | |
| 2009/0109102 A1 | 4/2009 | Dokai et al. | |
| 2009/0160719 A1 | 6/2009 | Kato et al. | |
| 2009/0262041 A1 | 10/2009 | Ikemoto et al. | |

FOREIGN PATENT DOCUMENTS

| | | |
|---|---|---|
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 841 005 A1 | 10/2007 |
| EP | 2 009 738 A1 | 12/2008 |
| EP | 2 148 449 A1 | 1/2010 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |

| | | | | | | |
|---|---|---|---|---|---|---|
| JP | 08-330372 A | 12/1996 | | JP | 2002-150245 A | 5/2002 |
| JP | 09-014150 A | 1/1997 | | JP | 2002-157564 A | 5/2002 |
| JP | 09-035025 A | 2/1997 | | JP | 2002-158529 A | 5/2002 |
| JP | 9-93029 A | 4/1997 | | JP | 2002-175508 A | 6/2002 |
| JP | 09-245381 A | 9/1997 | | JP | 2002-183690 A | 6/2002 |
| JP | 09-252217 A | 9/1997 | | JP | 2002-185358 A | 6/2002 |
| JP | 09-270623 A | 10/1997 | | JP | 2002-204117 A | 7/2002 |
| JP | 9-512367 A | 12/1997 | | JP | 2002-522849 A | 7/2002 |
| JP | 10-69533 A | 3/1998 | | JP | 2002-230128 A | 8/2002 |
| JP | 10-069533 A | 3/1998 | | JP | 2002-232221 A | 8/2002 |
| JP | 10-505466 A | 5/1998 | | JP | 2002-252117 A | 9/2002 |
| JP | 10-171954 A | 6/1998 | | JP | 2002-259934 A | 9/2002 |
| JP | 10-193849 A | 7/1998 | | JP | 2002-280821 A | 9/2002 |
| JP | 10-193851 A | 7/1998 | | JP | 2002-298109 A | 10/2002 |
| JP | 10-293828 A | 11/1998 | | JP | 2002-308437 A | 10/2002 |
| JP | 11-039441 A | 2/1999 | | JP | 2002-319008 A | 10/2002 |
| JP | 11-075329 A | 3/1999 | | JP | 2002-319009 A | 10/2002 |
| JP | 11-085937 A | 3/1999 | | JP | 2002-319812 A | 10/2002 |
| JP | 11-102424 A | 4/1999 | | JP | 2002-362613 A | 12/2002 |
| JP | 11-103209 A | 4/1999 | | JP | 2002-373029 A | 12/2002 |
| JP | 11-149536 A | 6/1999 | | JP | 2002-373323 A | 12/2002 |
| JP | 11-149538 A | 6/1999 | | JP | 2002-374139 A | 12/2002 |
| JP | 11-219420 A | 8/1999 | | JP | 2003-006599 A | 1/2003 |
| JP | 11-220319 A | 8/1999 | | JP | 2003-016412 A | 1/2003 |
| JP | 11-328352 A | 11/1999 | | JP | 2003-026177 A | 1/2003 |
| JP | 11-346114 A | 12/1999 | | JP | 2003-030612 A | 1/2003 |
| JP | 11-515094 A | 12/1999 | | JP | 2003-44789 A | 2/2003 |
| JP | 2000-21128 A | 1/2000 | | JP | 2003-046318 A | 2/2003 |
| JP | 2000-021639 A | 1/2000 | | JP | 2003-58840 A | 2/2003 |
| JP | 2000-022421 A | 1/2000 | | JP | 2003-067711 A | 3/2003 |
| JP | 2005-229474 A | 1/2000 | | JP | 2003-069335 A | 3/2003 |
| JP | 2000-059260 A | 2/2000 | | JP | 2003-076947 A | 3/2003 |
| JP | 2000-085283 A | 3/2000 | | JP | 2003-76963 A | 3/2003 |
| JP | 2000-090207 A | 3/2000 | | JP | 2003-78333 A | 3/2003 |
| JP | 2000-132643 A | 5/2000 | | JP | 2003-078336 A | 3/2003 |
| JP | 2000-137778 A | 5/2000 | | JP | 2003-085501 A | 3/2003 |
| JP | 2000-137779 A | 5/2000 | | JP | 2003-085520 A | 3/2003 |
| JP | 2000-137785 A | 5/2000 | | JP | 2003-87008 A | 3/2003 |
| JP | 2000-148948 A | 5/2000 | | JP | 2003-87044 A | 3/2003 |
| JP | 2000-172812 A | 6/2000 | | JP | 2003-099720 A | 4/2003 |
| JP | 2000-209013 A | 7/2000 | | JP | 2003-099721 A | 4/2003 |
| JP | 2000-222540 A | 8/2000 | | JP | 2003-110344 A | 4/2003 |
| JP | 2000-510271 A | 8/2000 | | JP | 2003-132330 A | 5/2003 |
| JP | 2000-243797 A | 9/2000 | | JP | 2003-134007 A | 5/2003 |
| JP | 2000-251049 A | 9/2000 | | JP | 2003-155062 A | 5/2003 |
| JP | 2000-261230 A | 9/2000 | | JP | 2003-158414 A | 5/2003 |
| JP | 2000-276569 A | 10/2000 | | JP | 2003-168760 A | 6/2003 |
| JP | 2000-286634 A | 10/2000 | | JP | 2003-179565 A | 6/2003 |
| JP | 2000-286760 A | 10/2000 | | JP | 2003-187207 A | 7/2003 |
| JP | 2000-311226 A | 11/2000 | | JP | 2003-187211 A | 7/2003 |
| JP | 2000-321984 A | 11/2000 | | JP | 2003-188338 A | 7/2003 |
| JP | 3075400 U | 11/2000 | | JP | 2003-188620 A | 7/2003 |
| JP | 2000-349680 A | 12/2000 | | JP | 2003-198230 A | 7/2003 |
| JP | 2001-10264 A | 1/2001 | | JP | 2003-209421 A | 7/2003 |
| JP | 2001-028036 A | 1/2001 | | JP | 2003-216919 A | 7/2003 |
| JP | 2007-18067 A | 1/2001 | | JP | 2003-218624 A | 7/2003 |
| JP | 2001-043340 A | 2/2001 | | JP | 2003-233780 A | 8/2003 |
| JP | 2001-66990 A | 3/2001 | | JP | 2003-242471 A | 8/2003 |
| JP | 2001-505682 A | 4/2001 | | JP | 2003-243918 A | 8/2003 |
| JP | 2001-168628 A | 6/2001 | | JP | 2003-249813 A | 9/2003 |
| JP | 2001-188890 A | 7/2001 | | JP | 2003-529163 A | 9/2003 |
| JP | 2001-240046 A | 9/2001 | | JP | 2003-288560 A | 10/2003 |
| JP | 2001-256457 A | 9/2001 | | JP | 2003-309418 A | 10/2003 |
| JP | 2001-257292 A | 9/2001 | | JP | 2003-317060 A | 11/2003 |
| JP | 2001-514777 A | 9/2001 | | JP | 2003-331246 A | 11/2003 |
| JP | 2001-319380 A | 11/2001 | | JP | 2003-332820 A | 11/2003 |
| JP | 2001-331976 A | 11/2001 | | JP | 2004-040597 A | 2/2004 |
| JP | 2001-332923 A | 11/2001 | | JP | 2004-505481 A | 2/2004 |
| JP | 2001-339226 A | 12/2001 | | JP | 2004-082775 A | 3/2004 |
| JP | 2001-344574 A | 12/2001 | | JP | 2004-88218 A | 3/2004 |
| JP | 2001-351084 A | 12/2001 | | JP | 2004-93693 A | 3/2004 |
| JP | 2001-352176 A | 12/2001 | | JP | 2004-096566 A | 3/2004 |
| JP | 2002-024776 A | 1/2002 | | JP | 2004-127230 A | 4/2004 |
| JP | 2002-026513 A | 1/2002 | | JP | 2004-519916 A | 7/2004 |
| JP | 2002-042076 A | 2/2002 | | JP | 2004-234595 A | 8/2004 |
| JP | 2002-063557 A | 2/2002 | | JP | 2004-253858 A | 9/2004 |
| JP | 2002-505645 A | 2/2002 | | JP | 2004-527864 A | 9/2004 |
| JP | 2002-76750 A | 3/2002 | | JP | 2004-280390 A | 10/2004 |
| JP | 2002-076750 A | 3/2002 | | JP | 2004-287767 A | 10/2004 |

| | | |
|---|---|---|
| JP | 2004-297249 A | 10/2004 |
| JP | 2004-297681 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-128592 A | 5/2005 |
| JP | 2005-129019 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-345802 A | 12/2005 |
| JP | 2005-346820 A | 12/2005 |
| JP | 2005-352858 A | 12/2005 |
| JP | 2006-025390 A | 1/2006 |
| JP | 2006-031766 A | 2/2006 |
| JP | 2006-033298 A | 2/2006 |
| JP | 2006-39902 A | 2/2006 |
| JP | 2006-42059 A | 2/2006 |
| JP | 2006-42097 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2007-007888 A | 1/2007 |
| JP | 2007-13120 A | 1/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-122542 A | 5/2007 |
| JP | 2007-124443 A | 5/2007 |
| JP | 2007-150642 A | 6/2007 |
| JP | 2007-150868 A | 6/2007 |
| JP | 2007-156632 A | 6/2007 |
| JP | 2007-159083 A | 6/2007 |
| JP | 2007-159129 A | 6/2007 |
| JP | 2007-228325 A | 9/2007 |
| JP | 2007-266999 A | 10/2007 |
| JP | 2007-312350 A | 11/2007 |
| JP | 2008-72243 A | 3/2008 |
| JP | 4069958 B2 | 4/2008 |
| JP | 2008-160874 A | 7/2008 |
| JP | 11-175678 A | 1/2009 |
| JP | 2009-25870 A | 2/2009 |
| JP | 2009-27291 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |
| WO | 2007/083574 A1 | 7/2007 |
| WO | 2007/083575 A1 | 7/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/140037 A1 | 11/2008 |
| WO | 2009/011376 A1 | 1/2009 |
| WO | 2009/081719 A1 | 7/2009 |

OTHER PUBLICATIONS

Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using The Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.

Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Devices and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Kato et al.: "Component of Wireless IC Device and Wireless IC Device"; U.S. Appl. No. 12/944,099, filed Nov. 11, 2010.
Kataya et al.: "Radio Frequency IC Device and Electronic Apparatus"; U.S. Appl. No. 12/235,753, filed Sep. 23, 2008.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communication issued in counterpart Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato.: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.

Dokai et al.: "Wireless IC Device, and Component for Wireless IC Device"; U.S. Appl. No. 11/930,818, filed Oct. 31, 2007.

Kato et al.: "Wireless IC Device"; U.S. Appl. No. 12/042,399, filed Mar. 5, 2008.

Official communication issued in related U.S. Appl. No. 12/042,399; mailed on Aug. 25, 2008.

Official Communication issued in corresponding Chinese Patent Application No. 200880000137, mailed on Mar. 29, 2012.

Official Communication issued in corresponding Japanese Patent Application No. 2008-104960, mailed on Mar. 13, 2012.

* cited by examiner

RADIO FREQUENCY IC DEVICE AND ELECTRONIC APPARATUS

BACKGROUND OF THE INVENTION

1. Field of the Invention

The present invention relates to radio frequency IC devices, and, more particularly, to a radio frequency IC device including a radio frequency IC chip used in an RFID (Radio Frequency Identification) system and an electronic apparatus including the radio frequency IC device.

2. Description of the Related Art

Recently, an RFID system has been developed as a product management system in which a reader/writer arranged to generate an induction field communicates with an IC chip (hereinafter also referred to as an IC tag or a radio frequency IC chip) attached to a product or a case in a non-contact manner so as to obtain predetermined information stored in the IC chip.

Japanese Unexamined Patent Application Publication (Translation of PCT Application) No. 11-515094 discloses an RFID tag including an IC chip mounted on the main surface of a printed circuit board and an antenna provided in the printed circuit board. In this RFID tag, the antenna and the IC chip are electrically connected to each other. The miniaturization of the RFID tag is achieved by providing the antenna in the printed circuit board.

However, the number of manufacturing processes required to produce the RFID tag is increased in order to prepare the dedicated antenna, and a space is required for the dedicated antenna. This leads to increases in the manufacturing cost and size of the RFID tag. As illustrated in FIG. 2 in Japanese Unexamined Patent Application Publication (Translation of PCT Application) No. 11-515094, the number of manufacturing processes is increased especially if an antenna having a meander shape is formed, since internal electrodes included in a plurality of layers must be processed. Furthermore, in order to achieve the impedance matching between the IC chip and the antenna, a matching section is required. If the matching section is disposed between the antenna and the IC chip, the size of the antenna is increased. Furthermore, if the IC chip is modified, the shape of the antenna must be changed.

SUMMARY OF THE INVENTION

To overcome the problems described above, preferred embodiments of the present invention provide a small radio frequency IC device capable of easily achieving impedance matching without using a dedicated antenna and an electronic apparatus including the radio frequency IC device.

A radio frequency IC device according to a first preferred embodiment of the present invention includes a radio frequency IC chip arranged to process a transmitted/received signal, a circuit board on which the radio frequency IC chip is mounted, an electrode arranged on the circuit board, and a loop electrode that is arranged on the circuit board so that the loop electrode is coupled to the radio frequency IC chip and the electrode.

A radio frequency IC device according to a second preferred embodiment of the present invention includes an electromagnetic coupling module including a radio frequency IC chip arranged to process a transmitted/received signal and a power supply circuit board that includes an inductance element coupled to the radio frequency IC chip, a circuit board on which the electromagnetic coupling module is mounted, an electrode arranged on the circuit board, and a loop electrode that is arranged on the circuit board so that the loop electrode is coupled to the power supply circuit board and the electrode.

In the radio frequency IC device according to the first preferred embodiment, a radio frequency IC chip or a power supply circuit board is preferably coupled to an electrode arranged at a circuit board, for example, a ground electrode via a loop electrode. The electrode arranged on the circuit board functions as a radiation plate (an antenna) for the radio frequency IC chip. That is, the electrode receives a signal, and the radio frequency IC chip receives the signal from the electrode via the loop electrode and is operated by the received signal. A response signal output from the radio frequency IC chip is transmitted to the electrode via the loop electrode, and is then emitted from the electrode to the outside. Accordingly, a dedicated antenna is not required, and a space is not required for the dedicated antenna. The loop electrode can perform the impedance matching between the radio frequency IC chip and the electrode. Accordingly, a matching section is not necessarily required. Therefore, the efficiency of signal transmission between the radio frequency IC chip and the electrode is improved.

In a radio frequency IC device according to the second preferred embodiment, a power supply circuit board is disposed between a radio frequency IC, for example, a radio frequency IC chip and a loop electrode. This power supply circuit board includes a resonance circuit including an inductance element and/or a matching circuit. A frequency to be used is set by the resonance circuit and/or the matching circuit. If the radio frequency IC chip is changed in accordance with a frequency used by an RFID system, only a change in design of the resonance circuit and/or the matching circuit is required. It is not necessary to change the shape, size, and/or location of a radiation plate (electrode) or the state of coupling between the loop electrode and the electrode or the power supply circuit board. The resonance circuit and/or the matching circuit can also function to achieve the impedance matching between the radio frequency IC chip and the electrode. Accordingly, the efficiency of signal transmission between the radio frequency IC chip and the electrode is improved.

In the radio frequency IC device, the loop electrode is preferably coupled to the radio frequency IC chip or the power supply circuit board may preferably include a plurality of layers included in a multilayer circuit board.

The radio frequency IC chip stores various pieces of information about a product to which the radio frequency IC device is attached, and, furthermore, may be a re-writable radio frequency IC chip. That is, the radio frequency IC chip may have an information processing function in addition to an RFID system function.

According to preferred embodiments of the present invention, an existing electrode included in a circuit board can preferably be used as an antenna. Since a dedicated antenna is not required, a radio frequency IC device and an apparatus including the radio frequency IC device can be miniaturized. A resonance circuit and/or a matching circuit included in a loop electrode and/or a power supply circuit board may have an impedance matching function. Accordingly, a matching section is not necessarily required.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1A:
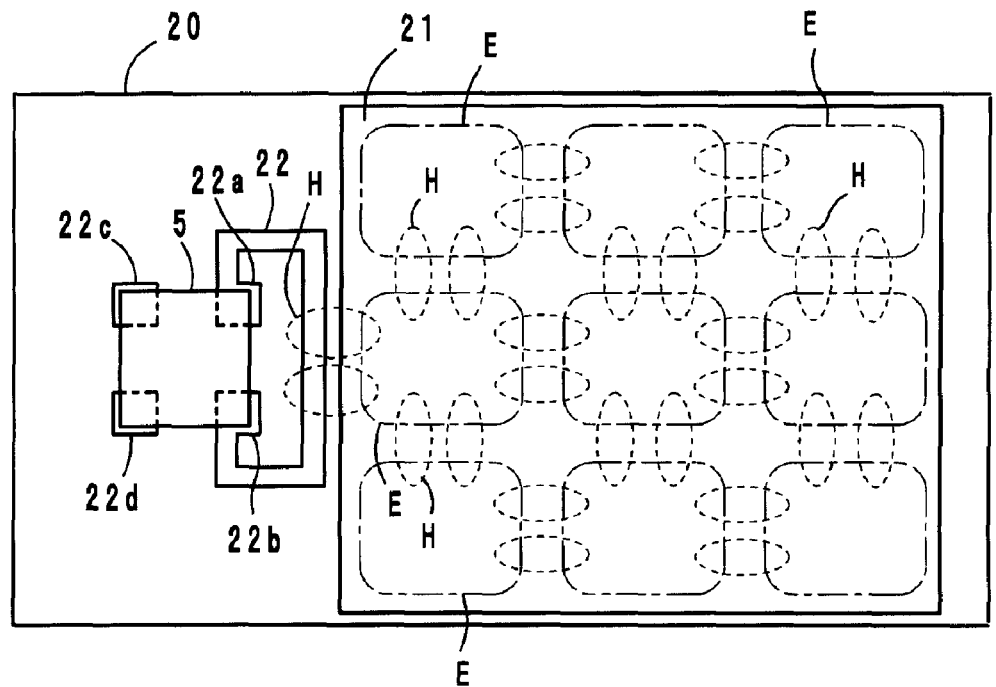
FIG. 1A is a plan view of a radio frequency IC device according to a first preferred embodiment of the present invention.

A radio frequency IC device and an electronic apparatus according to preferred embodiments of the present invention will be described below with reference to the accompanying drawings. In the drawings, the same numerals are used for similar components and portions so as to avoid repeated explanation.

First Preferred Embodiment

Figure 1B:
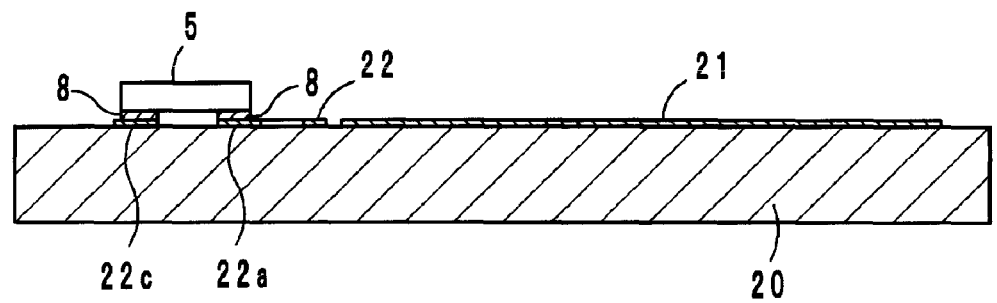
FIG. 1B is a cross-sectional view in a lengthwise direction of the radio frequency IC device according to the first preferred embodiment of the present invention.

FIGS. 1A and 1B are diagrams illustrating a radio frequency IC device according to the first preferred embodiment of the present invention. This radio frequency IC device includes a radio frequency IC chip 5 arranged to process a transmitted/received signal of a predetermined frequency, a printed circuit board 20 on which the radio frequency IC chip 5 is mounted, and a ground electrode 21 and a loop electrode 22 which are arranged on the printed circuit board 20. Each of the ground electrode 21 and the loop electrode 22 is formed on the main surface of the printed circuit board 20 preferably by applying coating of conductive paste thereto or by etching metal foil on the printed circuit board 20.

Figure 2:
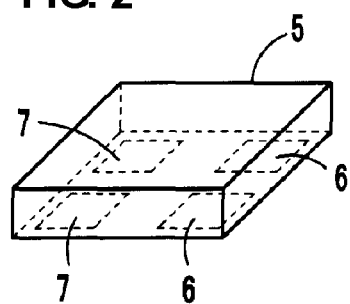
FIG. 2 is a perspective view of a radio frequency IC chip.

The radio frequency IC chip 5 includes a clock circuit, a logic circuit, and a memory circuit, and stores necessary information. As illustrated in FIG. 2, input-output terminal electrodes 6 and mounting terminal electrodes 7 are provided on the undersurface of the radio frequency IC chip 5. One of the input-output terminal electrodes 6 is electrically connected to a connection electrode 22a disposed at one end of the loop electrode 22 via a metal bump 8, and the other one of the input-output terminal electrodes 6 is electrically connected to a connection electrode 22b disposed at the other end of the loop electrode 22 via the metal bump 8. A pair of connection electrodes 22c and 22d is disposed on the printed circuit board 20. One of the mounting terminal electrodes 7 of the radio frequency IC chip 5 is connected to the connection electrode 22c via the metal bump 8, and the other one of the mounting terminal electrodes 7 is connected to the connection electrode 22d via the metal bump 8.

The loop electrode 22 is arranged near the edge of the ground electrode 21 in the horizontal direction, whereby the loop electrode 22 and the ground electrode 21 are coupled to each other by electric field coupling. That is, by arranging the loop electrode 22 near the ground electrode on the same surface, a loop magnetic field H (denoted by a dotted line in FIG. 1A) is generated from the loop electrode 22 in the vertical direction. The generated loop magnetic field H enters the ground electrode 21 substantially at right angles, so that a loop electric field E (denoted by an alternate long and short dashed line in FIG. 1A) is excited. The loop electric field E induces another loop magnetic field H. Thus, the loop electric field E and the loop magnetic field H are generated on the entire surface of the ground electrode 21, so that a high-frequency signal is emitted. As described above, by arranging the ground electrode 21 and the loop electrode 22 close to each other on the same main surface while providing the electrical isolation between them, the electromagnetic field coupling therebetween is effectively achieved. Consequently, a radiation characteristic is improved.

The electromagnetic coupling between the loop electrode 22 and the ground electrode 21 enables a high-frequency signal received by the ground electrode 21 from a reader/writer to be transmitted to the radio frequency IC chip 5 via the loop electrode 22 so as to activate the radio frequency IC chip 5, and enables a response signal output from the radio frequency IC chip 5 to be transmitted to the ground electrode 21 via the loop electrode 22 and then be emitted from the ground electrode 21 toward the reader-writer.

The ground electrode 21 may preferably be defined by an existing component included in the printed circuit board 20 of an electronic apparatus containing the radio frequency IC device. Alternatively, a ground electrode used for another electronic component included in an electronic apparatus may be used as the ground electrode 21, for example. Accordingly, in this radio frequency IC device, a dedicated antenna is not required, and a space is not required for the antenna. Furthermore, since a large ground electrode 21 is used, a radiation characteristic is improved.

By controlling the length and width of the loop electrode 22 and the space between the loop electrode 22 and the ground electrode 21, the impedance matching between the radio frequency IC chip 5 and the ground electrode 21 can be achieved.

Second Preferred Embodiment

Figure 3A:
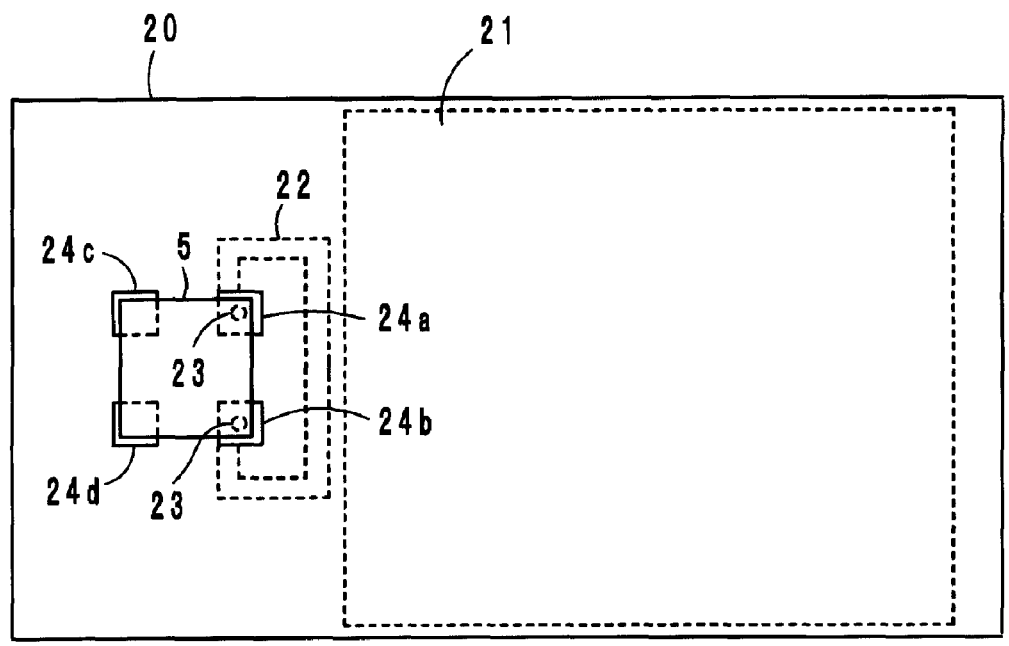
FIG. 3A is a plan view of a radio frequency IC device according to a second preferred embodiment of the present invention.
Figure 3B:
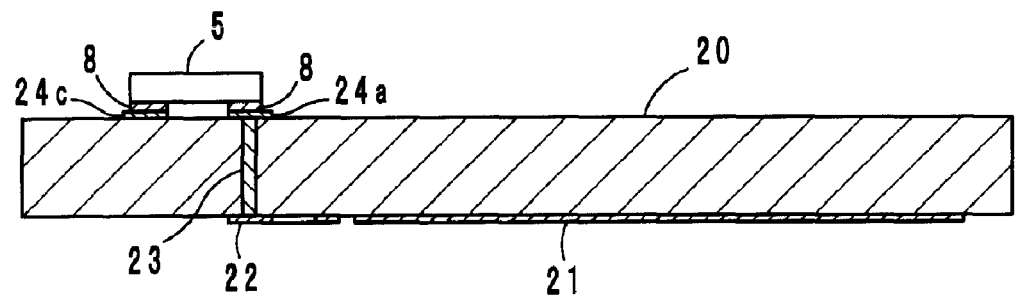
FIG. 3B is a cross-sectional view in a lengthwise direction of the radio frequency IC device according to the second preferred embodiment of the present invention.

FIGS. 3A and 3B are diagrams illustrating a radio frequency IC device according to the second preferred embodiment of the present invention. This radio frequency IC device is substantially the same as a radio frequency IC device according to the first preferred embodiment. The ground electrode 21 and the loop electrode 22 are disposed on the bottom surface of the printed circuit board 20. Connection electrodes 24a to 24d are provided on the surface of the printed circuit board 20. The connection electrodes 24a and 24b are electrically connected through a via-hole conductor 23 to one end of the loop electrode 22 and the other end of the loop electrode 22, respectively. The connection electrodes 24a to 24d correspond to the connection electrodes 22a to 22d illustrated in FIGS. 1A and 1B. One of the input-output terminal electrodes 6 (see FIG. 2) is preferably electrically connected to the connection electrode 24a via the metal bump 8, for example, and the other one of the input-output terminal electrodes 6 is preferably electrically connected to the connection electrode 24b via the metal bump 8, for example. One of the mounting terminal electrodes 7 (see, FIG. 2) is preferably connected to the connection electrode 24c via the metal bump 8, for example, and the other one of the mounting terminal electrodes 7 is preferably connected to the connection electrode 24d via the metal bump 8, for example.

The ground electrode 21 and the loop electrode 22 are coupled in substantially the same manner as that described in the first preferred embodiment. The operational advantages of a radio frequency IC device according to the second preferred embodiment are substantially the same as those of a radio frequency IC device according to the first preferred embodiment. In this preferred embodiment, a large space for another electronic component can be obtained on the upper surface of the circuit board 20.

Third Preferred Embodiment

Figure 4A:
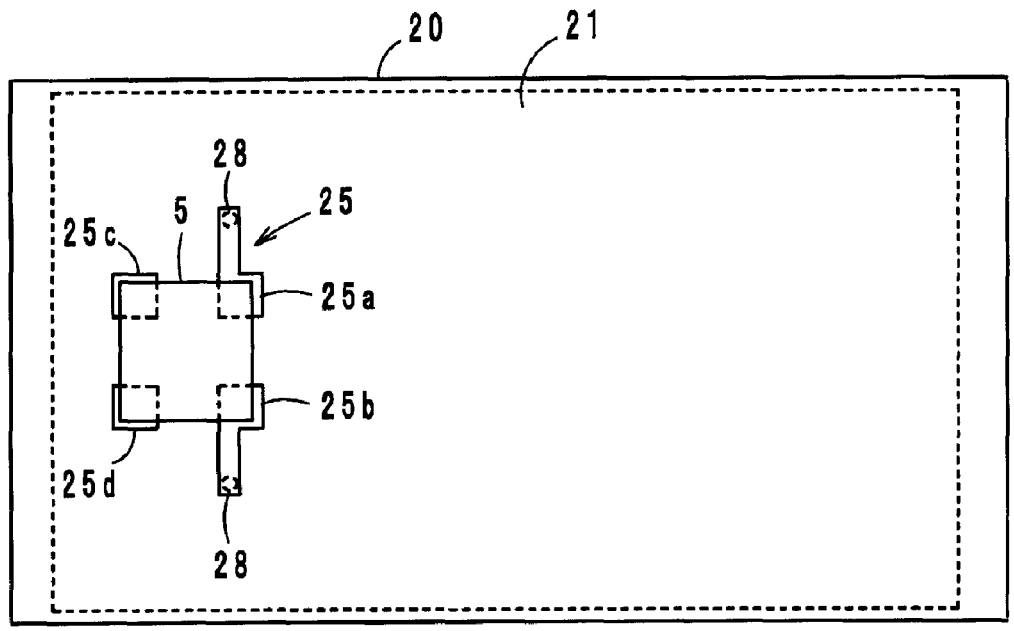
FIG. 4A is a plan view of a radio frequency IC device according to a third preferred embodiment of the present invention.
Figure 4B:
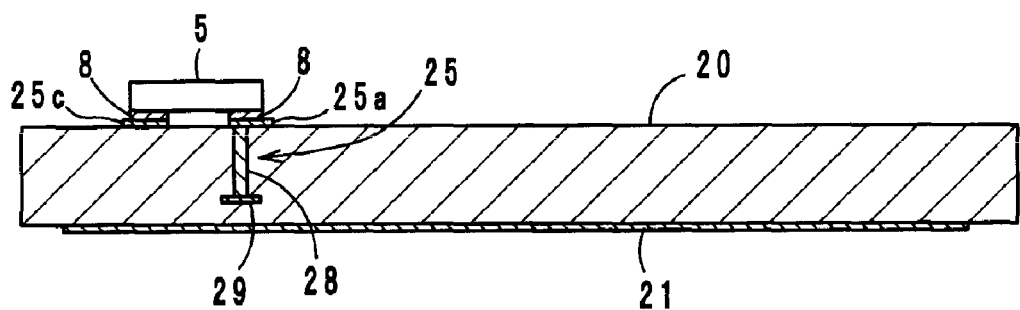
FIG. 4B is a cross-sectional view in a lengthwise direction of the radio frequency IC device according to the third preferred embodiment of the present invention.
Figure 4C:
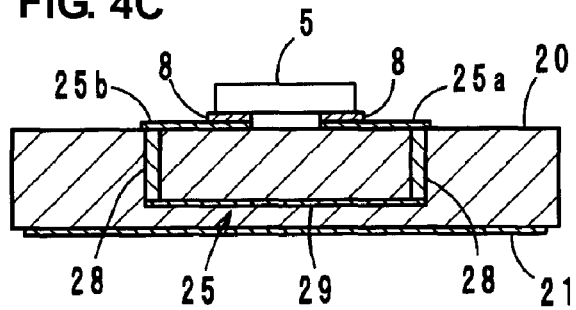
FIG. 4C is a cross-sectional view in a widthwise direction of the radio frequency IC device according to the third preferred embodiment of the present invention.

FIGS. 4A to 4C are diagrams illustrating a radio frequency IC device according to the third preferred embodiment of the present invention. In this radio frequency IC device, a loop electrode 25 includes connection electrodes 25a and 25b disposed on the surface of the printed circuit board 20, via-hole conductors 28, and an internal electrode 29. The loop electrode 25 is coupled to the ground electrode 21 disposed on the bottom surface of the printed circuit board 20 by electric field coupling. The connection electrodes 25a and 25b are preferably electrically connected via the metal bump 8 to the terminal electrodes 6 (see, FIG. 2). Connection electrodes 25c and 25d are electrically connected via the metal bump 8 to the terminal electrodes 7 (see, FIG. 2).

The loop electrode 25 is arranged near the ground electrode 21 in the vertical direction, and is coupled to the ground electrode 21 by electric field coupling. That is, a magnetic flux is generated from the loop electrode 25 near the surface on which the ground electrode 21 is arranged, and an electric field that intersects the magnetic field substantially at right angles is generated from the ground electrode 21. As a result, an electric field loop is excited on the ground electrode 21. The excited electric field loop generates a magnetic field loop. Thus, the electric field loop and the magnetic field loop are generated on substantially the entire surface of the ground electrode 21, such that a high-frequency signal is emitted. That is, by arranging the loop electrode 25 near the ground electrode 21 in the vertical direction while providing the electric isolation between the loop electrode 25 and the ground electrode 21, the flexibility in the placement of the loop electrode 25 can be increased.

The operation and operational advantages of a radio frequency IC device according to the third preferred embodiment are substantially the same as those of a radio frequency IC device according to the first preferred embodiment. In this preferred embodiment, since the loop electrode 25 is disposed in the printed circuit board 20, interference caused by the penetration of a magnetic field from the outside can be prevented. The ground electrode 21 may be formed in the printed circuit board 20. In this case, since a large space can be obtained on the main surface and the bottom surface of the printed circuit board 20, another line or another electronic component may be disposed thereon so as to increase the packing density.

Fourth Preferred Embodiment

Figure 5A:
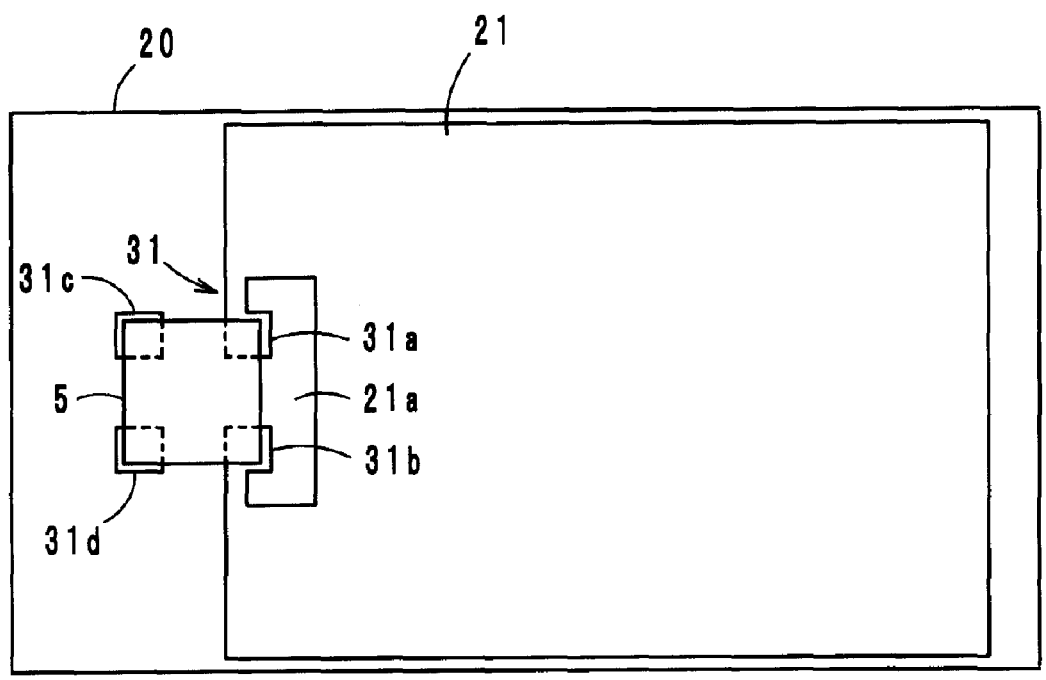
FIG. 5A is a plan view of a radio frequency IC device according to a fourth preferred embodiment of the present invention.
Figure 5B:
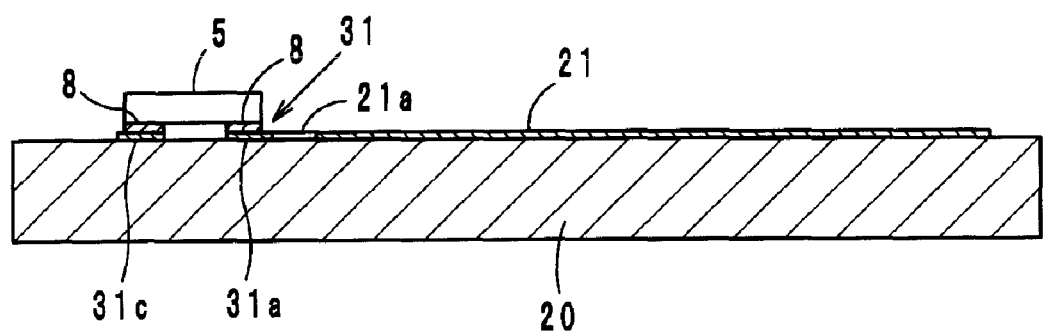
FIG. 5B is a cross-sectional view in a lengthwise direction of the radio frequency IC device according to the fourth preferred embodiment of the present invention.

FIGS. 5A and 5B are diagrams illustrating a radio frequency IC device according to the fourth preferred embodiment of the present invention. This radio frequency IC device includes a loop electrode 31 obtained by providing a cutout 21a at one side of the ground electrode 21 disposed on the surface of the printed circuit board 20. Connection electrodes 31a and 31b are electrically connected via the metal bump 8 to one of the input-output terminal electrodes 6 (see, FIG. 2) and the other one of the input-output terminal electrodes 6, respectively. Connection electrodes 31c and 31d provided on the surface of the printed circuit board 20 are electrically connected via the metal bump 8 to the mounting terminal electrodes 7 (see, FIG. 2) of the radio frequency IC chip 5.

In the fourth preferred embodiment, the loop electrode 31 is electrically coupled to the ground electrode 21. The radio frequency IC chip 5 is coupled to the ground electrode 21 via the loop electrode 31 arranged therebetween. The operation and operational advantages of a radio frequency IC device according to the fourth preferred embodiment are substantially the same as those of a radio frequency IC device according to the first preferred embodiment.

Fifth Preferred Embodiment

Figure 6A:
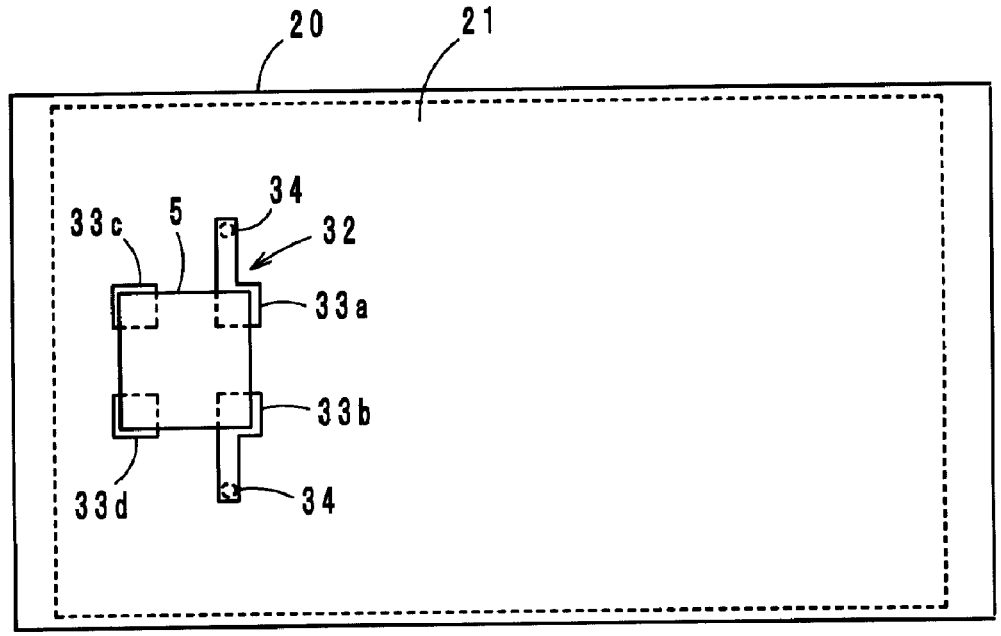
FIG. 6A is a plan view of a radio frequency IC device according to a fifth preferred embodiment of the present invention.
Figure 6B:
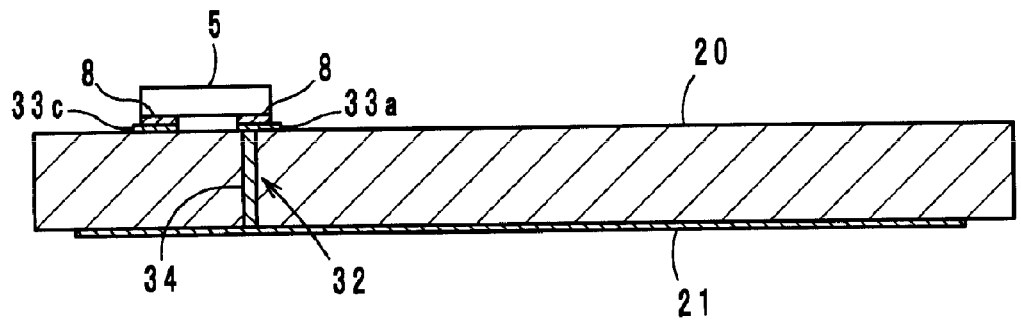
FIG. 6B is a cross-sectional view in a lengthwise direction of the radio frequency IC device according to the fifth preferred embodiment of the present invention.
Figure 6C:
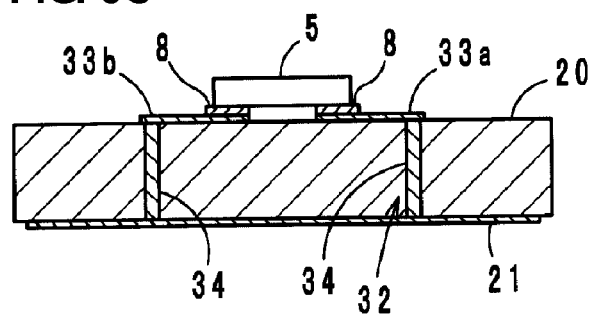
FIG. 6C is a cross-sectional view in a widthwise direction of the radio frequency IC device according to the fifth preferred embodiment of the present invention.

FIGS. 6A to 6C are diagrams illustrating a radio frequency IC device according to the fifth preferred embodiment of the present invention. Similar to a radio frequency IC device according to the fourth preferred embodiment, in this radio frequency IC device, the ground electrode 21 is electrically coupled to a loop electrode 32. More specifically, the loop electrode 32 includes connection electrodes 33a and 33b disposed on the surface of the printed circuit board 20 and via-hole conductors 34. The ground electrode 21 is disposed on the bottom surface of the printed circuit board 20. The upper end of one of the via-hole conductors 34 is electrically connected to the connection electrode 33a, and the upper end of the other one of the via-hole conductors 34 is electrically connected to the connection electrode 33b. The lower ends of the via-hole conductors 34 are electrically connected to the ground electrode 21. The connection electrodes 33a and 33b are electrically connected via the metal bump 8 to the terminal electrodes 6 (see, FIG. 2) of the radio frequency IC chip 5. Connection electrodes 33c and 33d are electrically connected via the metal bump 8 to the terminal electrodes 7 (see, FIG. 2) of the radio frequency IC chip 5.

In the fifth preferred embodiment, the loop electrode 32 is electrically coupled to the ground electrode 21. The radio frequency IC chip 5 and the ground electrode 21 are coupled to each other via the loop electrode 32 disposed therebetween. The operation and operational advantages of a radio frequency IC device according to the fifth preferred embodiment are substantially the same as those of a radio frequency IC device according to the first preferred embodiment.

Sixth Preferred Embodiment

Figure 7A:
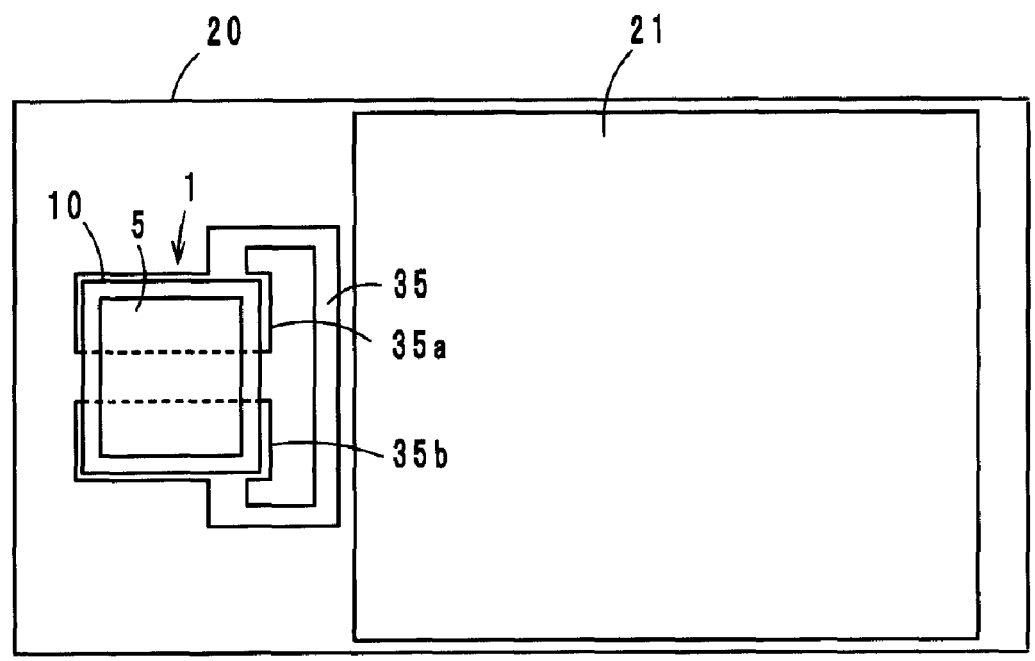
FIG. 7A is a plan view of a radio frequency IC device according to a sixth preferred embodiment of the present invention.
Figure 7B:
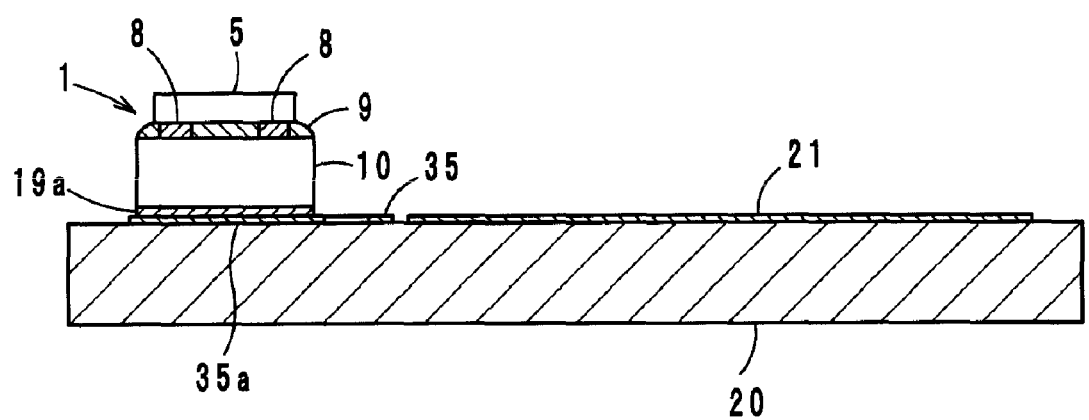
FIG. 7B is a cross-sectional view in a lengthwise direction of the radio frequency IC device according to the sixth preferred embodiment of the present invention.

FIGS. 7A and 7B are diagrams illustrating a radio frequency IC device according to the sixth preferred embodiment of the present invention. In this radio frequency IC device, an electromagnetic coupling module 1 is provided by mounting the radio frequency IC chip 5 on a power supply circuit board 10. The electromagnetic coupling module 1 is electrically connected to a loop electrode 35 provided on the printed circuit board 20. Similar to the loop electrode 22 described in the first preferred embodiment, the loop electrode 35 is arranged near the ground electrode 21 provided on the surface of the printed circuit board 20, whereby the loop electrode 35 and the ground electrode 21 are coupled to each other by magnetic field coupling.

One of the input-output terminal electrodes 6 of the radio frequency IC chip 5, which are illustrated in FIG. 2, and the other one of the input-output terminal electrodes 6 are electrically connected via the metal bump 8 to electrodes 12a and 12b (see, FIGS. 15 and 16) provided on the surface of the power supply circuit board 10. One of the mounting terminal electrodes 7 of the radio frequency IC chip 5 and the other one of the mounting terminal electrodes 7 are electrically connected via the metal bump 8 to electrodes 12c and 12d. A protection film 9 is disposed between the surface of the power supply circuit board 10 and the bottom surface of the radio frequency IC chip 5 so as to improve the bonding strength between the power supply circuit board 10 and the radio frequency IC chip 5.

The power supply circuit board 10 includes a resonance circuit (not illustrated in FIGS. 7A and 7B) including an inductance element. Outer electrodes 19a and 19b (see, FIGS. 15 and 16) are provided on the bottom surface of the power supply circuit board 10, and the connection electrodes 12a to 12d (see, FIGS. 15 and 16) are provided on the surface of the power supply circuit board 10. The outer electrodes 19a and 19b are electromagnetically coupled to the resonance circuit included in the power supply circuit board 10, and are electrically connected to connection electrodes 35a and 35b of the loop electrode 35, respectively, with an electroconductive adhesive (not illustrated), for example. Alternatively, such electrical connection may be established by soldering.

That is, the power supply circuit board 10 includes a resonance circuit having a predetermined resonance frequency so as to transmit a transmission signal of a predetermined frequency output from the radio frequency IC chip 5 to the ground electrode 21 via the outer electrodes 19a and 19b and the loop electrode 35, or select a received signal of a predetermined frequency from among signals received by the ground electrode 21 and supply the selected received signal to the radio frequency IC chip 5. Accordingly, in this radio frequency IC device, the radio frequency IC chip 5 is operated by a signal received by the ground electrode 21, and a response signal output from the radio frequency IC chip 5 is emitted from the ground electrode 21.

In the electromagnetic coupling module 1, the outer electrodes 19a and 19b provided on the bottom surface of the power supply circuit board 10 are coupled to the resonance circuit included in the power supply circuit board 10 by electromagnetic field coupling, and are electrically connected to the loop electrode 35 that is coupled to the ground electrode defining an antenna by electric field coupling. In this preferred embodiment, since a relatively large antenna element is not required as a separate component, the size of the electromagnetic coupling module 1 can be reduced. Furthermore, the size of the power supply circuit board 10 can be reduced. Accordingly, IC mounters that have been widely used can be used to mount the radio frequency IC chip 5 on the power supply circuit board 10. This reduces the cost of mounting. When a frequency band to be used is changed, only the design of the resonance circuit needs to be changed.

An inductance element alone may be used as an element provided in the power supply circuit board 10. The inductance element has a function of achieving the impedance matching between the radio frequency IC chip 5 and a radiation plate (the ground electrode 21).

Seventh Preferred Embodiment

Figure 8A:
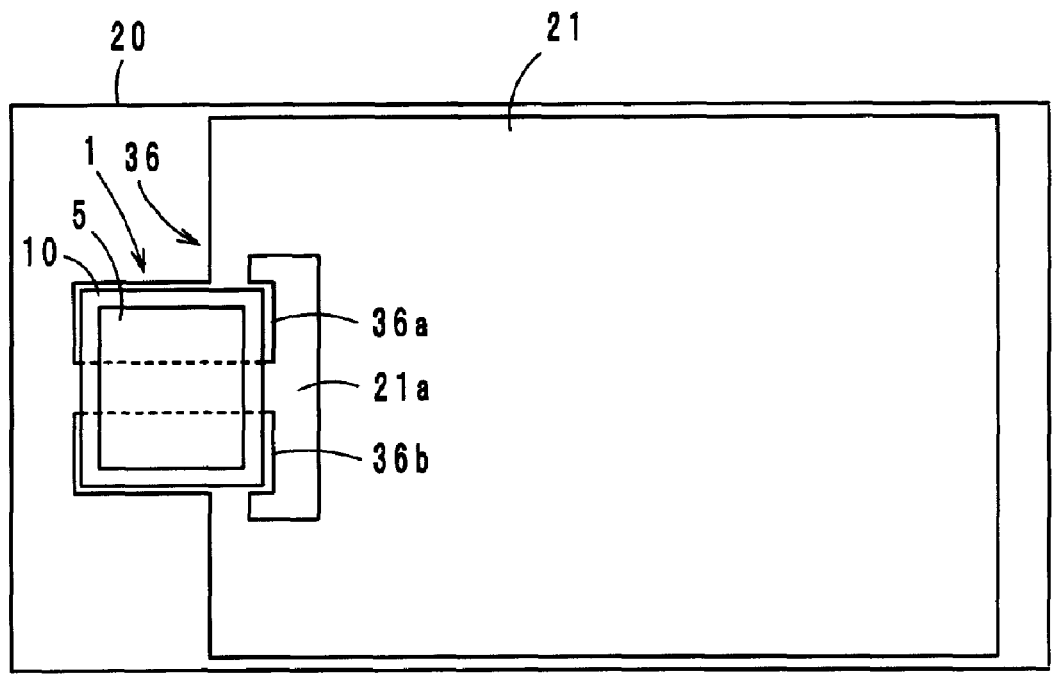
FIG. 8A is a plan view of a radio frequency IC device according to a seventh preferred embodiment of the present invention.
Figure 8B:
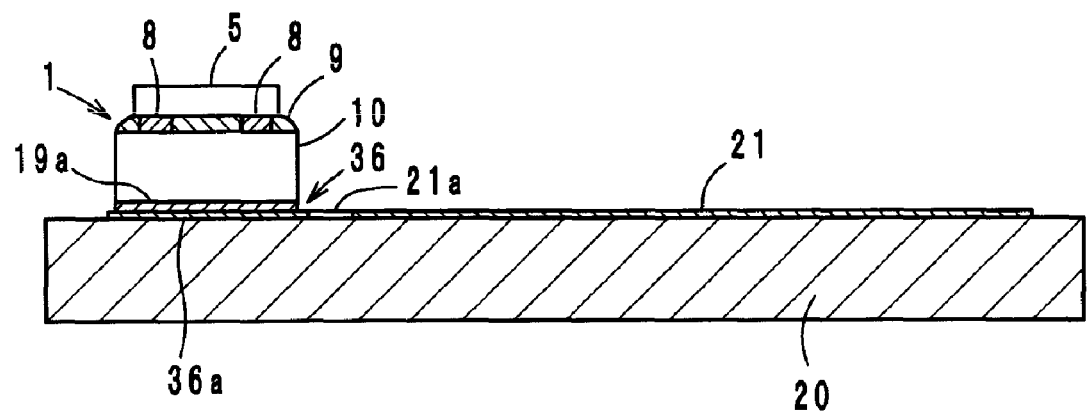
FIG. 8B is a cross-sectional view in a lengthwise direction of the radio frequency IC device according to the seventh preferred embodiment of the present invention.

FIGS. 8A and 8B are diagrams illustrating a radio frequency IC device according to the seventh preferred embodiment of the present invention. Similar to a radio frequency IC device according to the sixth preferred embodiment, in this radio frequency IC device, the electromagnetic coupling module 1 is formed by mounting the radio frequency IC chip 5 on the power supply circuit board 10. The electromagnetic coupling module 1 is electrically connected to a loop electrode 36 provided on the printed circuit board 20. Similar to the loop electrode 31 described in the fourth preferred embodiment, the loop electrode 36 is obtained by forming the cutout 21a at one side of the ground electrode 21. Connection electrodes 36a and 36b are electrically connected to the outer electrodes 19a and 19b provided on the bottom surface of the power supply circuit board 10, with a conductive adhesive (not illustrated), for example. In the seventh preferred embodiment, the structure and operation of the power supply circuit board 10 are substantially the same as those described in the sixth preferred embodiment, and the operation of the loop electrode 36 is substantially the same as that described in the fourth preferred embodiment.

Eighth Preferred Embodiment

Figure 9:
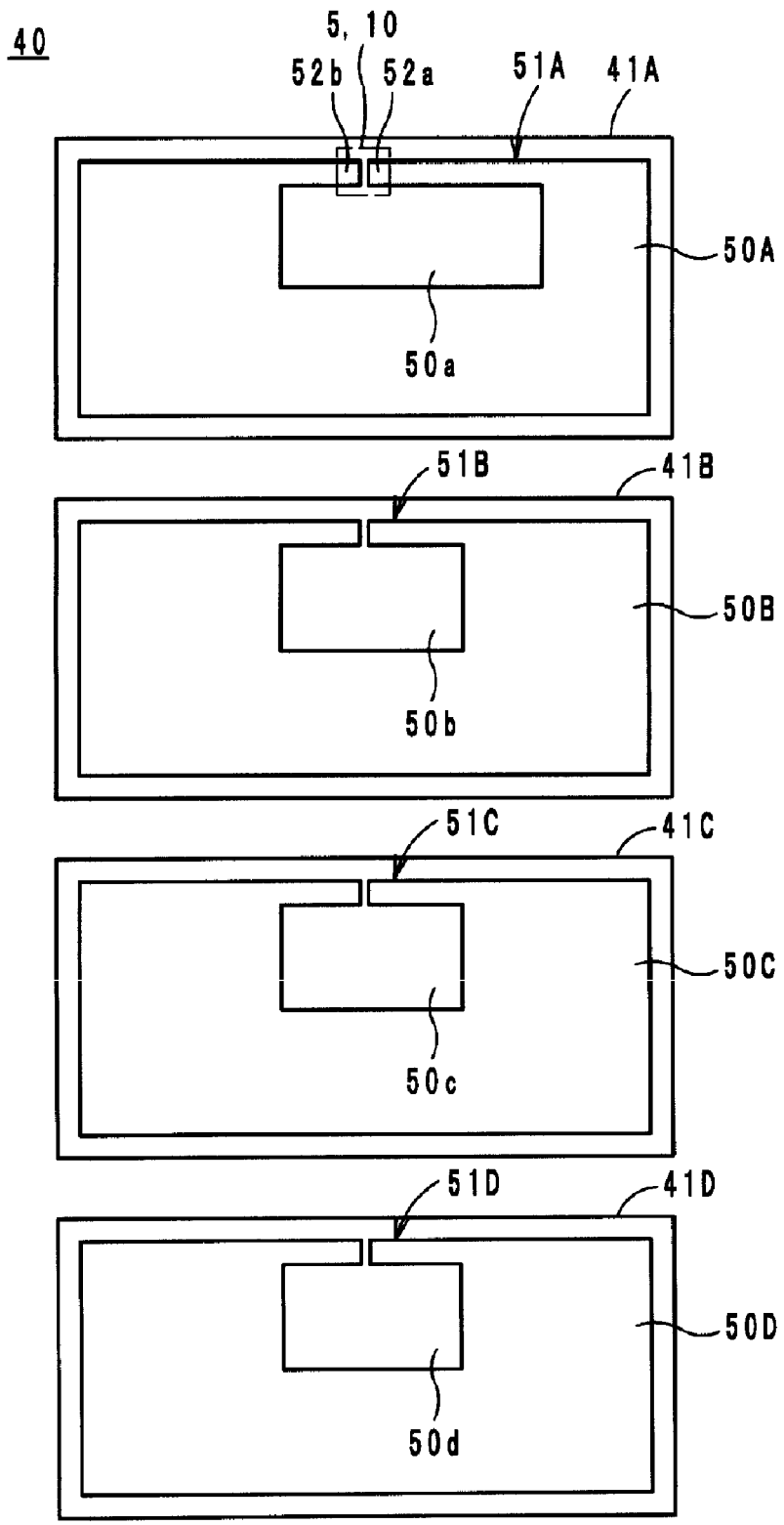
FIG. 9 is an exploded plan view of a circuit board of a radio frequency IC device according to an eighth preferred embodiment of the present invention.

FIG. 9 is an exploded view of a printed circuit board included in a radio frequency IC device according to the eighth preferred embodiment of the present invention. The printed circuit board 40 is a multilayer board in which a plurality of dielectric layers or magnetic layers are laminated. Loop electrodes 51A to 51D are provided on a first layer 41A defining the surface of the printed circuit board 40, a second layer 41B, a third layer 41C, and a fourth layer 41D defining the bottom surface of the printed circuit board 40.

Similar to the loop electrode described in the fourth preferred embodiment (see, FIGS. 5A and 5B), the loop electrodes 51A to 51D are obtained by providing cutouts 50a to 50d at ground electrodes 50A to 50D provided on the layers 41A to 41D. Connection electrodes 52a and 52b of the loop electrode 51A provided on the first layer 41A are respectively electrically connected to the input-output terminal electrodes 6 of the radio frequency IC chip 5, or are electromagnetically coupled to the power supply circuit board 10 (the electromagnetic coupling module 1). The ground electrodes 50A to 50D may be electrically connected to each other through via-hole conductors. An electrode functioning as an antenna may not necessarily be a ground electrode.

Referring to FIGS. 1A and 1B, the loop electrode 22 is preferably used so as to cause the ground electrode 21 to function as an antenna, and the loop electrode 22 has an impedance conversion function. More specifically, the loop electrode 22 has an impedance between the connection electrodes 22a and 22b which is determined by the shape of the loop. A current corresponding to a signal transmitted from the radio frequency IC chip 5 or the power supply circuit board 10 coupled to the connection electrodes 22a and 22b flows along the loop.

The impedance (Z) between the connection electrodes 22a and 22b is represented by the sum of a real part and an imaginary part (X). As the size of the loop electrode 22 is reduced, the length of a current path is reduced. As the length of the current path is reduced, the resistance generated at the loop electrode 22 and the impedance (X=ωL) of an inductance (L) generated by a current passing through the path are reduced. If a space for the loop electrode 22 is reduced in accordance with the miniaturization of an apparatus, such as a mobile telephone, for example, the impedance of the loop electrode 22 is significantly reduced. This produces a large impedance difference between the loop electrode 22 and a radio frequency IC chip or a power supply (resonance/matching) circuit. Consequently, sufficient electric power cannot be supplied from the radio frequency IC chip 5 or the power supply circuit to a radiation plate.

In order to solve this problem, a higher impedance (Z) must be set for the loop electrode 22, that is, the real part or the imaginary part (X) must be increased. The eighth to thirteenth preferred embodiments solve such a problem. Accordingly, in the eighth preferred embodiment, the ground electrode 50A functions as an antenna and provides the same operational advantages as those described in the first preferred embodiment. Furthermore, in the eighth preferred embodiment, the size of the loop electrode 51A, which is provided on the first layer 41A and coupled to the radio frequency IC chip 5 or the power supply circuit board 10, is greater than that of the other loop electrodes, that is, the loop electrodes 51B to 51D. Accordingly, the length of a current path passing through the loop electrode 51A at the time of communication is increased, the resistance is increased, and the real part is increased. As a result, a higher impedance (Z) is obtained.

Ninth Preferred Embodiment

Figure 10:
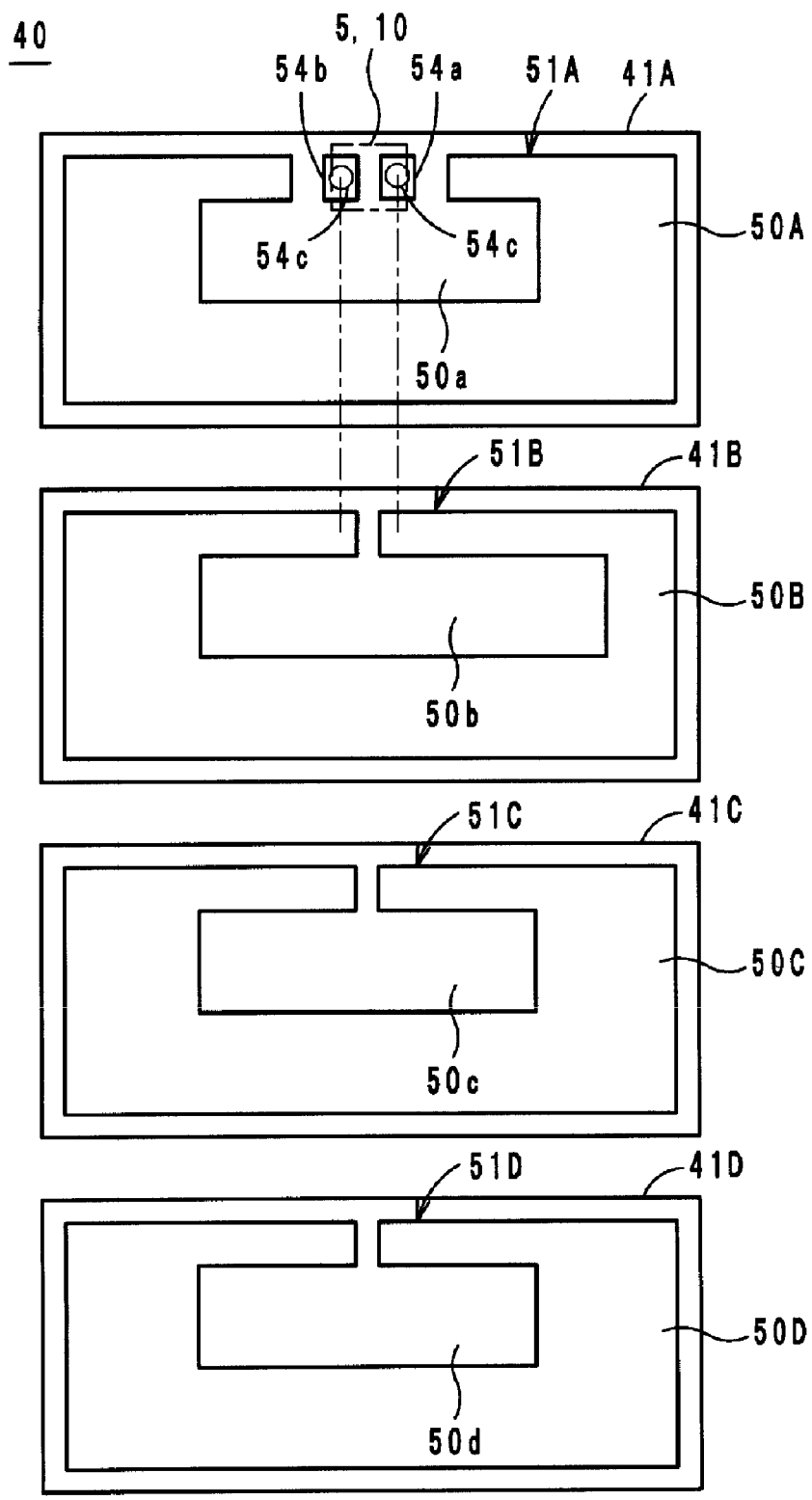
FIG. 10 is an exploded plan view of a circuit board of a radio frequency IC device according to a ninth preferred embodiment of the present invention.

FIG. 10 is an exploded view of the printed circuit board 40 included in a radio frequency IC device according to the ninth preferred embodiment of the present invention. A radio frequency IC device according to the ninth preferred embodiment is substantially the same as a radio frequency IC device according to the eighth preferred embodiment except that connection electrodes 54a and 54b provided on the first layer 41A and coupled to the radio frequency IC chip 5 or the power supply circuit board 10 are electrically connected to the loop electrode 51B provided on the second layer 41B through via-hole conductors 54c and the size of the loop electrode 51B is greater than that of the loop electrodes 51A, 51C, and 51D. Accordingly, the operational advantages of a radio frequency IC device according to the ninth preferred embodiment are substantially the same as those of a radio frequency IC device according to the eighth preferred embodiment.

Tenth Preferred Embodiment

Figure 11:
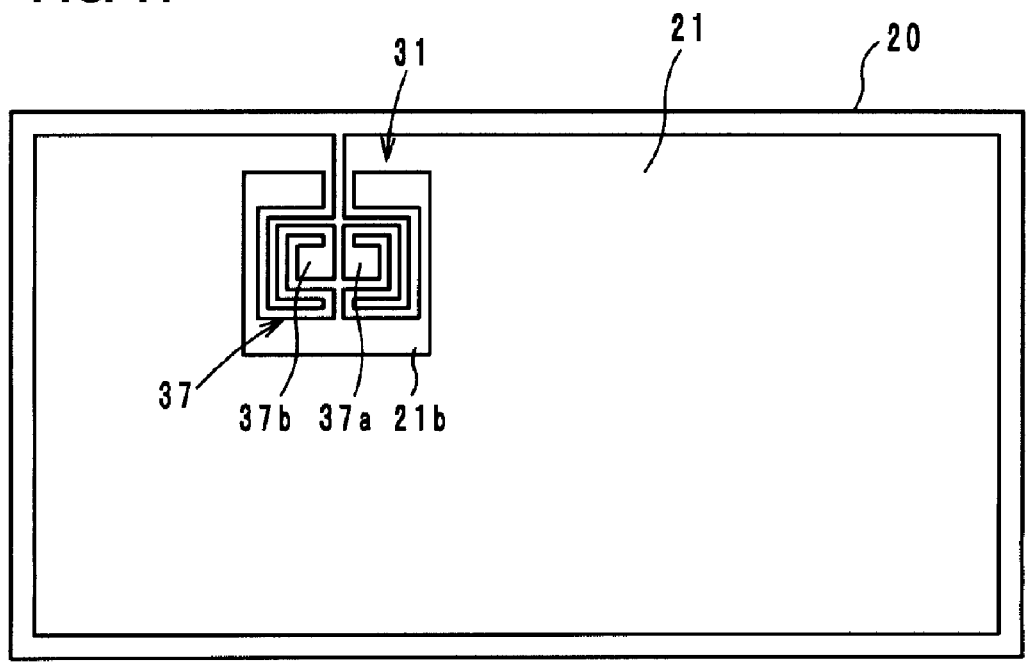
FIG. 11 is a plan view of a circuit board of a radio frequency IC device according to a tenth preferred embodiment of the present invention.

FIG. 11 is a diagram illustrating the printed circuit board 20 included in a radio frequency IC device according to the tenth preferred embodiment of the present invention. A cutout 21b is provided at the ground electrode 21 disposed on the surface of the printed circuit board 20. In the cutout 21b, the loop electrode 31 is provided. On the inner side of the loop electrode 31, a meandering matching electrode 37 is disposed. Connection electrodes 37a and 37b that are the ends of the matching electrode 37 are coupled to the radio frequency IC chip 5 or the power supply circuit board 10.

Similar to the above-described preferred embodiments, in the tenth preferred embodiment, the ground electrode 21 functions as an antenna, and provides substantially the same operational advantages as those described in the first preferred embodiment. The meandering matching electrode 37 disposed on the inner side of the loop electrode 31 increases the length of a current path flowing through the loop electrode 31. The resistance and the real part are therefore increased. As a result, the impedance (Z) is increased. The exemplary shape of the matching electrode 37 illustrated in FIG. 11 may be changed in accordance with the shape or size of the cutout 21b.

Eleventh Preferred Embodiment

Figure 12:
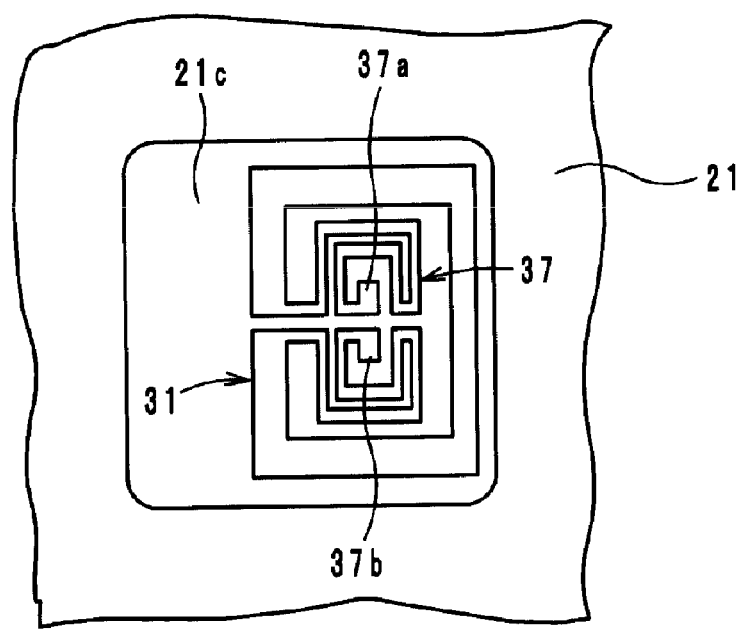
FIG. 12 is a plan view illustrating a main portion of a circuit board of a radio frequency IC device according to an eleventh preferred embodiment of the present invention.

FIG. 12 is a diagram illustrating the main portion of the printed circuit board 20 included in a radio frequency IC device according to the eleventh preferred embodiment of the present invention. A radio frequency IC device according to the eleventh preferred embodiment is substantially the same as a radio frequency IC device according to the tenth preferred embodiment except that the loop electrode 31 including the meandering matching electrode 37 on the inner side thereof is disposed in a cutout 21c of the ground electrode 21 and is coupled to the ground electrode 21 by electric field coupling in substantially the same manner as that described in the first preferred embodiment.

Similar to the tenth preferred embodiment, in this preferred embodiment, the connection electrodes 37a and 37b which are the ends of the matching electrode 37 are coupled to the radio frequency IC chip 5 or the power supply circuit board 10. The ground electrode 21 functions as an antenna, and provides the same operational advantages as those described in the first and tenth preferred embodiments.

Twelfth Preferred Embodiment

Figure 13:
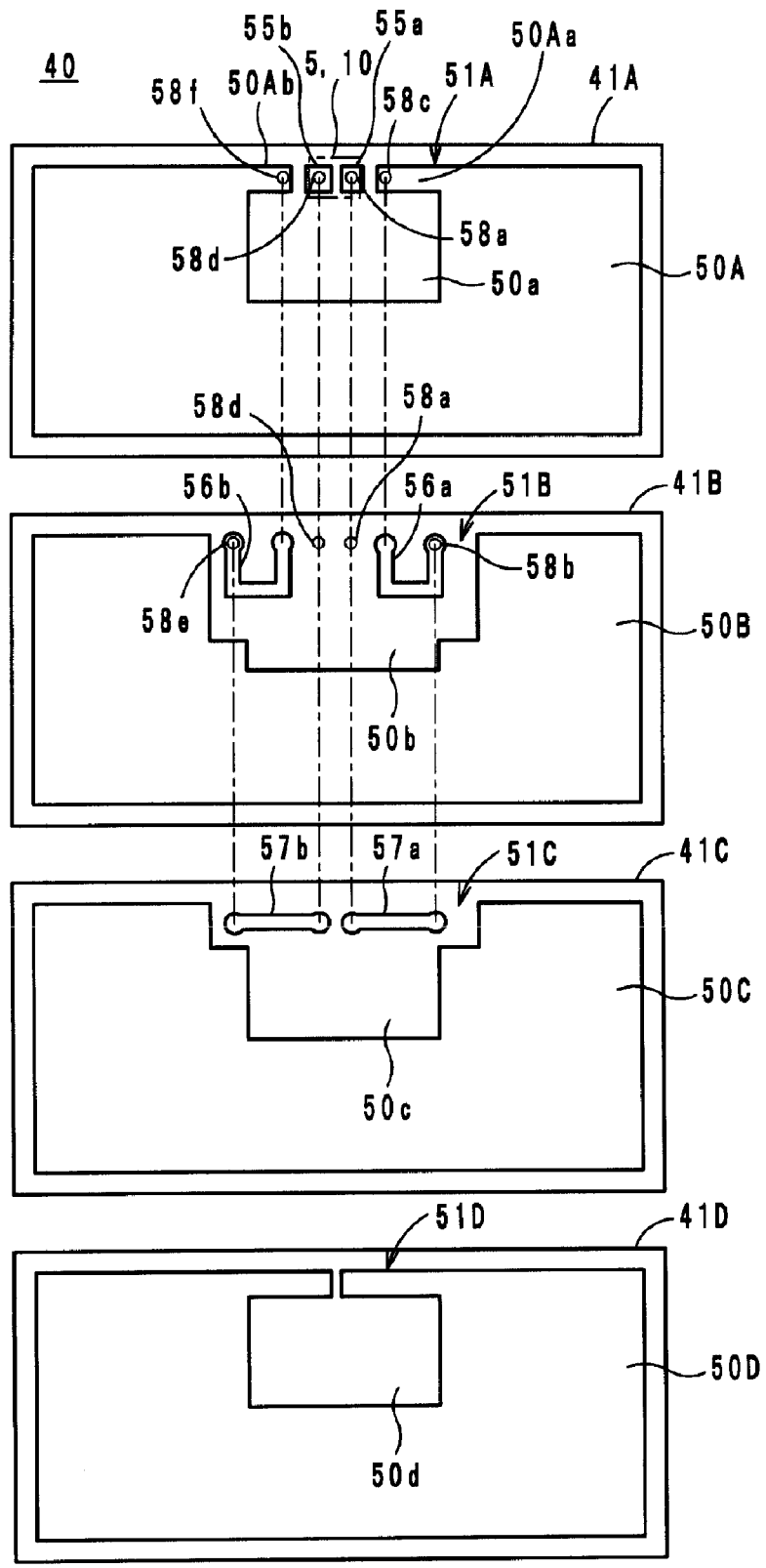
FIG. 13 is an exploded plan view of a circuit board of a radio frequency IC device according to a twelfth preferred embodiment of the present invention.

FIG. 13 is an exploded view of the printed circuit board 40 included in a radio frequency IC device according to the twelfth preferred embodiment of the present invention. Similar to a printed circuit board described in the eighth preferred embodiment (see, FIG. 9), the printed circuit board 40 is a multilayer board in which a plurality of dielectric layers or a plurality of magnetic layers are laminated. The loop electrodes 51A to 51D are provided on the first layer 41A defining the surface of the printed circuit board 40, the second layer 41B, the third layer 41C, and the fourth layer 41D defining the bottom surface of the printed circuit board 40, respectively.

The loop electrodes 51A to 51D are obtained by providing the cutouts 50a to 50d at the ground electrodes 50A to 50D provided on the layers 41A to 41D, respectively. Connection electrodes 55a and 55b provided on the first layer 41A are respectively electrically connected to the input-output terminal electrodes 6 of the radio frequency IC chip 5, or are electromagnetically coupled to the power supply circuit board 10 (the electromagnetic coupling module 1). The ground electrodes 50A to 50D may be electrically connected to each other through via-hole conductors. An electrode functioning as an antenna may not necessarily be a ground electrode.

Furthermore, matching electrodes 56a and 56b are disposed on the inner side of the loop electrode 51B, and matching electrodes 57a and 57b are disposed on the inner side of the loop electrode 51C. The connection electrode 55a is connected to one end of the matching electrode 57a through a via-hole conductor 58a, and the other end of the matching electrode 57a is connected to one end of the matching electrode 56a through a via-hole conductor 58b. The other end of the matching electrode 56a is connected to an end 50Aa of the ground electrode 50A through a via-hole conductor 58c. The connection electrode 55b is connected to one end of the matching electrode 57b through a via-hole conductor 58d, and the other end of the matching electrode 57b is connected to one end of a matching electrode 56b through a via-hole conductor 58e. The other end of the matching electrode 56b is connected to an end 50Ab of the ground electrode 50A through a via-hole conductor 58f.

Similar to the above-described preferred embodiments, in the twelfth preferred embodiment, the ground electrode 50A functions as an antenna, and provides the same operational advantages as those described in the first preferred embodiment. Furthermore, the length of a current path passing through the loop electrode 51A is increased by the matching electrodes 56a and 56b, which are disposed on the inner side of the loop electrode 51B, and the matching electrodes 57a and 57b, which are disposed on the inner side of the loop electrode 51C. The resistance and the real part are therefore increased. As a result, the impedance (Z) can be increased. In the twelfth preferred embodiment, since the matching electrodes 56a, 56b, 57a, and 57b are included in a laminated structure, the length of a current path can be increased even in a small apparatus and a relatively high impedance (Z) can be obtained.

Thirteenth Preferred Embodiment

Figure 14:
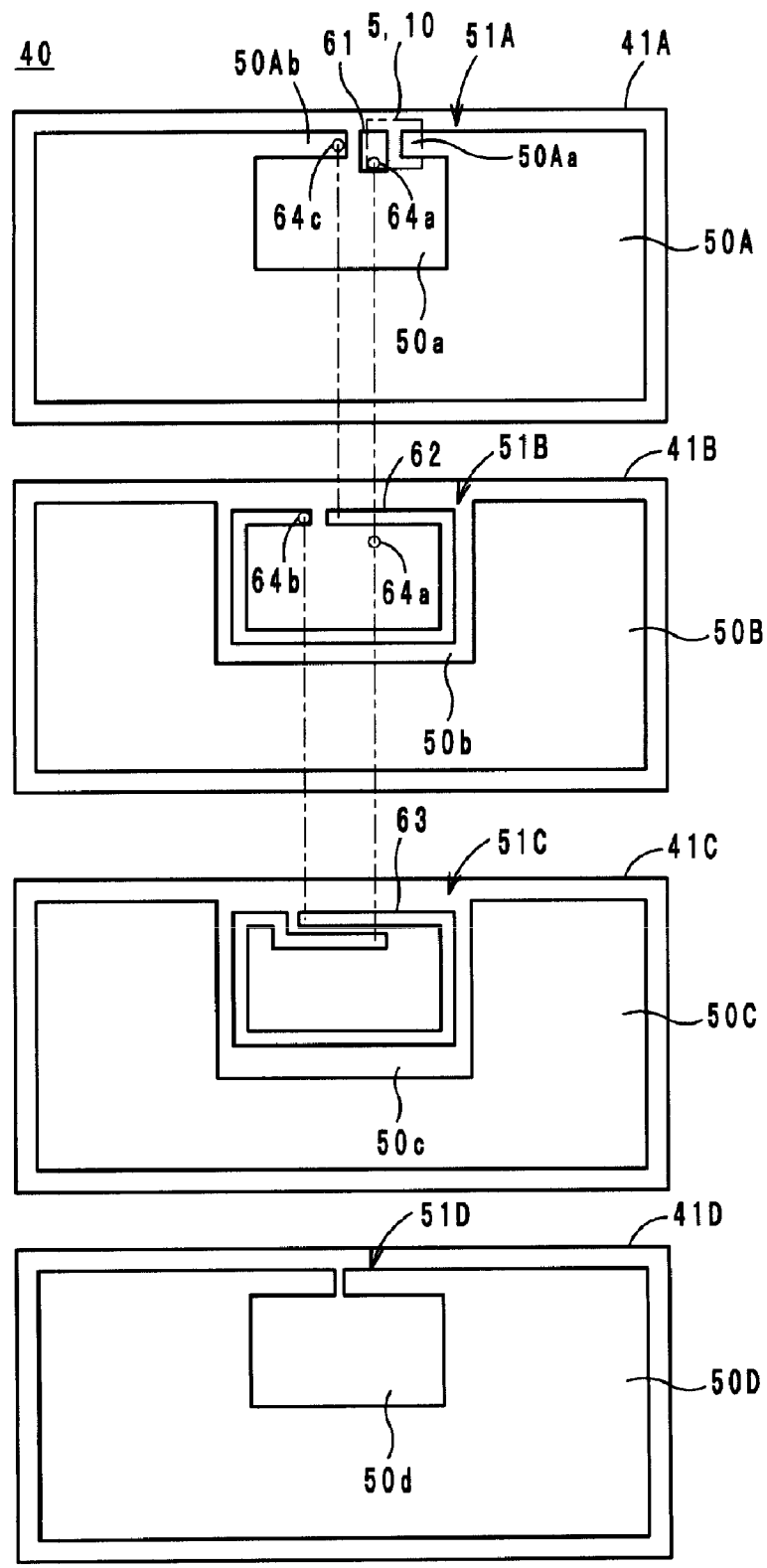
FIG. 14 is an exploded plan view of a circuit board of a radio frequency IC device according to a thirteenth preferred embodiment of the present invention.

FIG. 14 is an exploded view of the printed circuit board 40 included in a radio frequency IC device according to the thirteenth preferred embodiment of the present invention. Similar to the printed circuit board described in the eighth and twelfth preferred embodiments, the printed circuit board 40 is a multilayer board in which a plurality of dielectric layers or a plurality of magnetic layers are laminated. The loop electrodes 51A to 51D are provided on the first layer 41A defining the surface of the printed circuit board 40, the second layer 41B, the third layer 41C, and the fourth layer 41D defining the bottom surface of the printed circuit board 40, respectively.

The loop electrodes 51A to 51D are obtained by providing the cutouts 50a to 50d in the ground electrodes 50A to 50D provided on the layers 41A to 41D, respectively. A connection electrode 61 provided on the first layer 41A and the end 50Aa of the ground electrode 50A are electrically connected to the input-output terminal electrodes 6 of the radio frequency IC chip 5, or are electromagnetically coupled to the power supply circuit board 10 (the electromagnetic coupling module 1). The ground electrodes 50A to 50D may be electrically connected to each other through via-hole conductors. An electrode functioning as an antenna may not necessarily be a ground electrode.

Furthermore, matching electrodes 62 and 63 are disposed on the inner sides of the loop electrode 51B and 51c, respectively. The connection electrode 61 is connected to one end of the matching electrode 63 through a via-hole conductor 64a, and the other end of the matching electrode 63 is connected to one end of the matching electrode 62 through a via-hole conductor 64b. The other end of the matching electrode 62 is connected to the end 50Ab of the ground electrode 50A through a via-hole conductor 64c.

Similar to the above-described preferred embodiments, in the thirteenth preferred embodiment, the ground electrode 50A functions as an antenna, and provides the same operational advantages as those described in the first preferred embodiment. Furthermore, the length of a current path passing through the loop electrode 51A is increased by the matching electrodes 62 and 63 which are disposed on the inner sides of the loop electrodes 51B and 51C, respectively. The resistance and the real part are therefore increased. As a result, the impedance (Z) can be increased. Similar to the twelfth preferred embodiment, in the thirteenth preferred embodiment, since the matching electrodes 62 and 63 are included in a laminated structure, the length of a current path can be increased in a small apparatus and a relatively high impedance (Z) can be obtained.

First Example of Resonance Circuit

Figure 15:
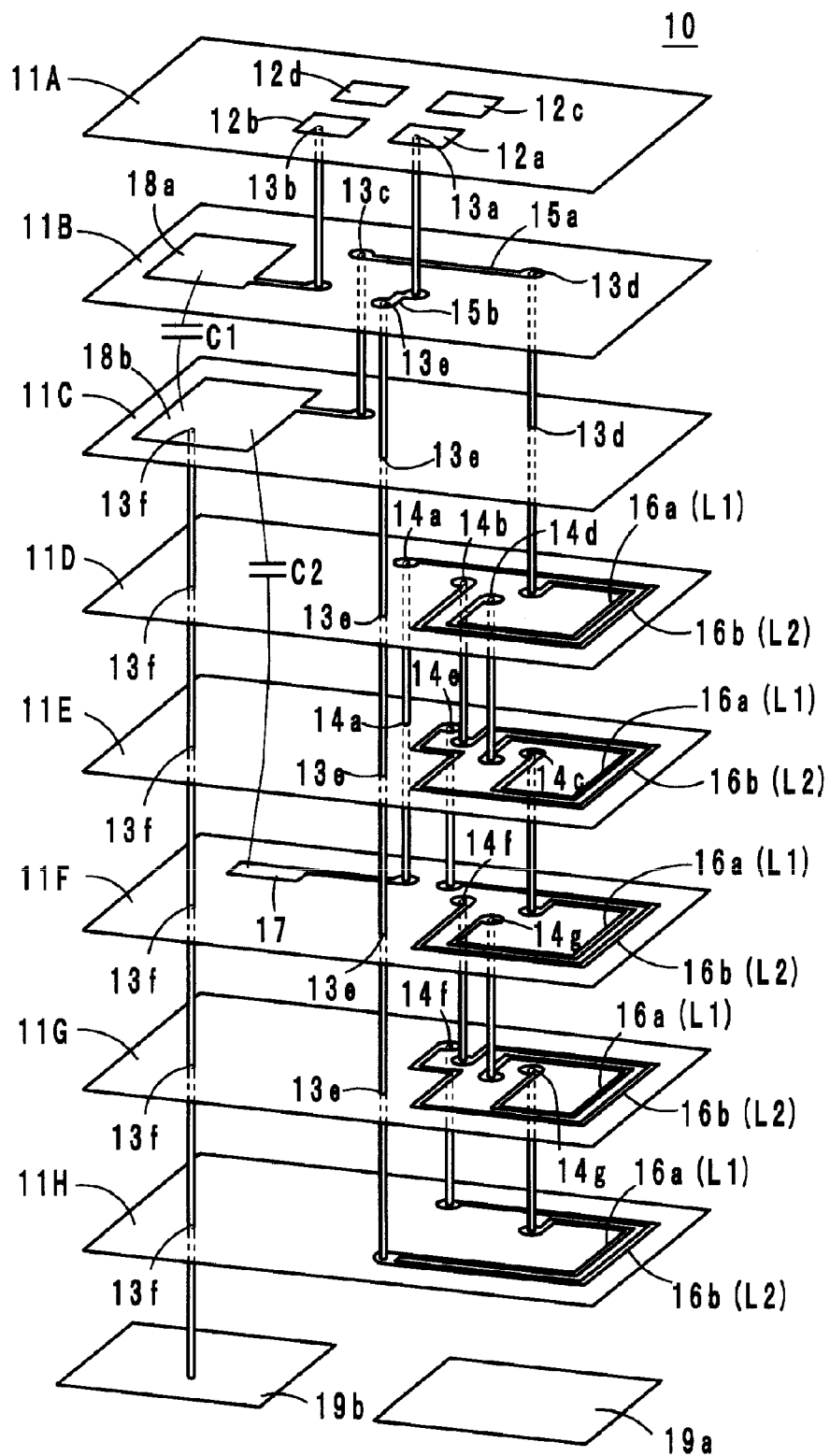
FIG. 15 is an exploded perspective view of a power supply circuit board including a first exemplary resonance circuit.

FIG. 15 is a diagram illustrating a first example of a resonance circuit included in the power supply circuit board 10. The power supply circuit board 10 is obtained by laminating, press-bonding, and firing ceramic sheets 11A to 11H made of a dielectric material. On the sheet 11A, the connection electrodes 12a and 12b, the electrodes 12c and 12d, and via-hole conductors 13a and 13b are provided. On the sheet 11B, a capacitor electrode 18a, conductor patterns 15a and 15b, and via-hole conductors 13c to 13e are provided. On the sheet 11C, a capacitor electrode 18b, the via-hole conductors 13d and 13e, and a via-hole conductor 13f are provided. On the sheet 11D, conductor patterns 16a and 16b, the via-hole conductors 13e and 13f, and via-hole conductors 14a, 14b, and 14d are provided. On the sheet 11E, the conductor patterns 16a and 16b, the via-hole conductors 13e, 13f, and 14a, and via-hole conductors 14c and 14e are provided. On the sheet 11F, a capacitor electrode 17, the conductor patterns 16a and 16b, the via-hole conductors 13e and 13f, and via-hole conductors 14f and 14g are provided. On the sheet 11G, the conductor patterns 16a and 16b and the via-hole conductors 13e, 13f, 14f, and 14g are provided. On the sheet 11H, the conductor patterns 16a and 16b and the via-hole conductor 13f are provided.

By laminating the sheets 11A to 11H, an inductance element L1, an inductance element L2, a capacitance element C1, and a capacitance element C2 are provided. The inductance element L1 includes the conductor patterns 16a that are helically connected by the via-hole conductors 14c, 14d, and 14g. The inductance element L2 includes the conductor patterns 16b that are helically connected by the via-hole conductors 14b, 14e, and 14f. The capacitance element C1 includes the capacitor electrodes 18a and 18b. The capacitance element C2 includes the capacitor electrodes 18b and 17.

One end of the inductance element L1 is connected to the capacitor electrode 18b through the via-hole conductor 13d, the conductor pattern 15a, and the via-hole conductor 13c. One end of the inductance element L2 is connected to the capacitor electrode 17 through the via-hole conductor 14a. The other ends of the inductance elements L1 and L2 are combined on the sheet 11H, and are then connected to the connection electrode 12a through the via-hole conductor 13e, the conductor pattern 15b, and the via-hole conductor 13a. The capacitor electrode 18a is electrically connected to the connection electrode 12b through the via-hole conductor 13b.

The connection electrodes 12a and 12b are respectively electrically connected via the metal bump 8 to the terminal electrodes 6 of the radio frequency IC chip 5. The electrodes 12c and 12d are respectively connected to the terminal electrodes 7 of the radio frequency IC chip 5.

On the bottom surface of the power supply circuit board 10, the outer electrodes 19a and 19b are provided by applying a coating of conductive paste thereto, for example. The outer electrode 19a is coupled to the inductance element L (L1 and L2) by magnetic field coupling. The outer electrode 19b is electrically connected to the capacitor electrode 18b through the via-hole conductor 13f. As described above, the outer electrodes 19a and 19b are electrically connected to the connection electrodes 35a and 35b of the loop electrode 35, or are electrically connected to the connection electrodes 36a and 36b of the loop electrode 36.

In this resonance circuit, the inductance elements L1 and L2 are obtained by the substantially parallel arrangement of two conductor patterns, that is, the conductor patterns 16a and 16b. Since the line lengths of the conductor patterns 16a and 16b are different from each other, the resonance frequencies of the inductance elements L1 and L2 are different from one another. Accordingly, a wider frequency band of a radio frequency IC device can be obtained.

Each of the ceramic sheets 11A to 11H may preferably be a ceramic sheet made of a magnetic material, for example. In this case, the power supply circuit board 10 can be easily obtained by a multilayer board manufacturing process including a sheet lamination method and a thick film printing method, for example.

Each of the sheets 11A to 11H may preferably be a flexible sheet made of a dielectric material, such as polyimide or liquid crystal polymer, for example. In this case, the inductance elements L1 and L2 and the capacitance elements C1 and C2 may be included in a laminate obtained by forming an electrode and a conductor on each of the flexible sheets using a thick film formation method and laminating these sheets by thermocompression bonding.

In the power supply circuit board 10, the inductance elements L1 and L2 and the capacitance elements C1 and C2 are disposed at different locations in a perspective plan view. The inductance elements L1 and L2 are coupled to the outer electrode 19a by magnetic field coupling. The outer electrode 19b functions as one electrode of the capacitance element C1.

Accordingly, in the electromagnetic coupling module 1 in which the radio frequency IC chip 5 is mounted on the power supply circuit board 10, the ground electrode 21 receives high-frequency signals (for example, UHF signals) emitted from a reader/writer (not illustrated). The electromagnetic coupling module 1 causes a resonance circuit, which is coupled to the outer electrodes 19a and 19b by magnetic field coupling and electric field coupling, to resonate via the loop electrode 35 or 36 so as to supply only a received signal that falls within a predetermined frequency range to the radio frequency IC chip 5. On the other hand, predetermined energy is extracted from the received signal, and is then used to cause the resonance circuit to match the frequency of information stored in the radio frequency IC chip 5 to a predetermined frequency and then transmit the information to the ground electrode 21 via the outer electrodes 19a and 19b and the loop electrode 35 or 36. The ground electrode 21 transmits or transfers the information to the reader/writer.

In the power supply circuit board 10, a resonance frequency characteristic is determined by a resonance circuit including the inductance elements L1 and L2 and the capacitance elements C1 and C2. The resonance frequency of a signal emitted from the ground electrode 21 is determined based on the self-resonance frequency of the resonance circuit.

The resonance circuit also functions as a matching circuit to perform the impedance matching between the radio frequency IC chip 5 and the ground electrode 21. The power supply circuit board 10 may include a matching circuit separately from a resonance circuit including an inductance element and a capacitance element (in this sense, a resonance circuit is also referred to as a matching circuit). If a matching circuit function is added to a resonance circuit, the design of the resonance circuit becomes complicated. If a matching circuit is provided separately from a resonance circuit, they can be separately designed. The loop electrodes 35 and 36 may have an impedance matching function or a resonance circuit function. In this case, by designing a resonance circuit (matching circuit) included in the power supply circuit board 10 in view of the shape of a loop electrode and the size of a ground electrode functioning as a radiation plate, a radiation characteristic can be improved.

Second Example of Resonance Circuit

Figure 16:
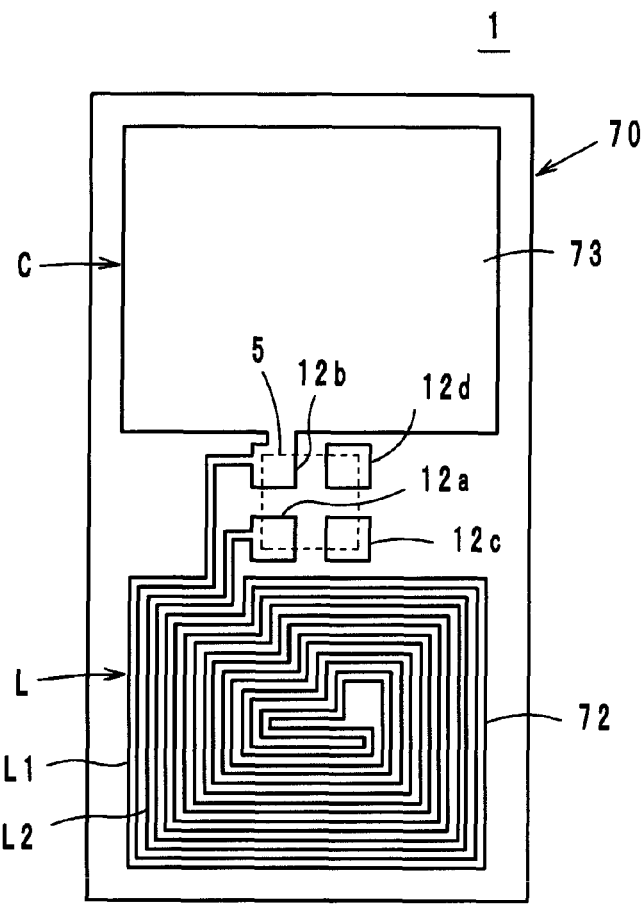
FIG. 16 is a plan view of a power supply circuit board including a second exemplary resonance circuit.

FIG. 16 is a diagram illustrating a second example of a resonance circuit included in a power supply circuit board 70. The power supply circuit board 70 is a flexible PET film on which a helical conductor pattern 72 functioning as an inductance element L and a capacitor electrode 73 functioning as a capacitance element C are provided. The electrodes 12a and 12b extending from the conductor pattern 72 and the capacitor electrode 73 are respectively electrically connected to the terminal electrodes 6 of the radio frequency IC chip 5. The electrodes 12c and 12d provided on the power supply circuit board 70 are respectively electrically connected to the terminal electrodes 7 of the radio frequency IC chip 5.

Similar to the above-described first example of a resonance circuit, a resonance circuit included in the power supply circuit board 70 includes the inductance element L and the capacitance element C, and is coupled to the electrode 35a or 36a facing the inductance element L by magnetic field coupling and the electrode 35b or 36b facing the capacitance element C by electric field coupling. In this second example, since the power supply circuit board 70 is made of a flexible film, the height of the electromagnetic coupling module 1 is reduced. In the inductance element L, a resonance frequency can be adjusted by changing an inductance value. Preferably, the inductance value can be changed by changing the line width or line space of the conductor pattern 72, for example.

Similar to the first example, in the second example, the inductance element L is obtained by helically arranging two conductor patterns, that is, the conductor patterns 72, and connecting them at a central portion of the helical structure. The conductor patterns 72 have different inductance values L1 and L2. Accordingly, similar to the first example, since the resonance frequencies of the conductor patterns 72 can be different from one another other, a wider usable frequency band of a radio frequency IC device can be obtained.

Electronic Apparatus

Figure 17:
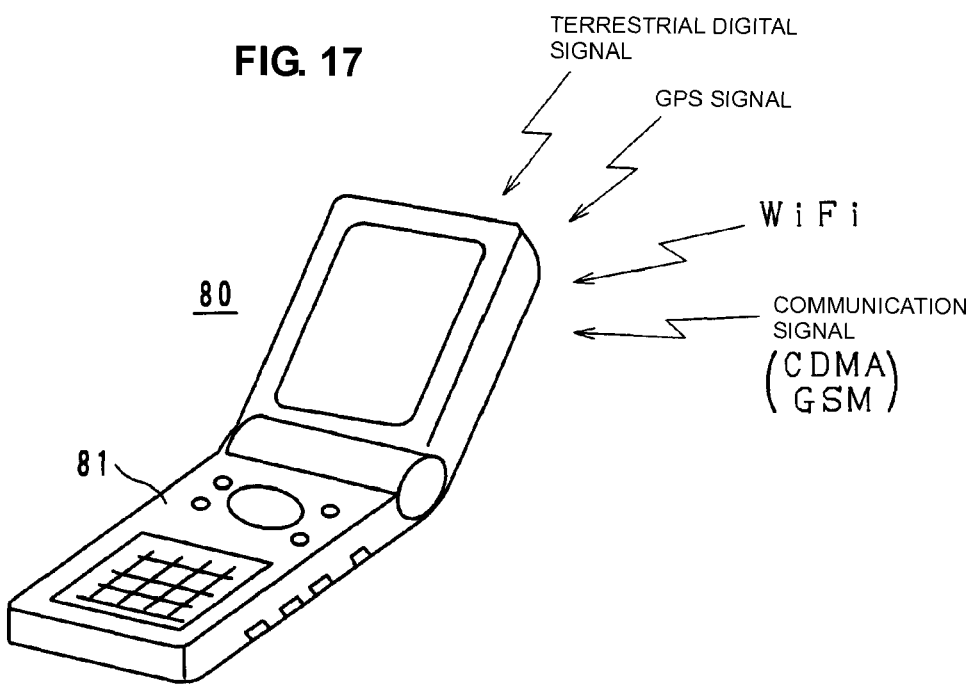
FIG. 17 is a perspective view of a mobile telephone that is an electronic apparatus according to a preferred embodiment of the present invention.

Next, a mobile telephone will be described as an example of an electronic apparatus according to a preferred embodiment of the present invention. A mobile telephone 80 illustrated in FIG. 17 is usable for a plurality of frequencies. Various signals such as a terrestrial digital signal, a GPS signal, a WiFi signal, a CDMA communication signal, and a GSM communication signal are input into the mobile telephone 80.

Figure 18:
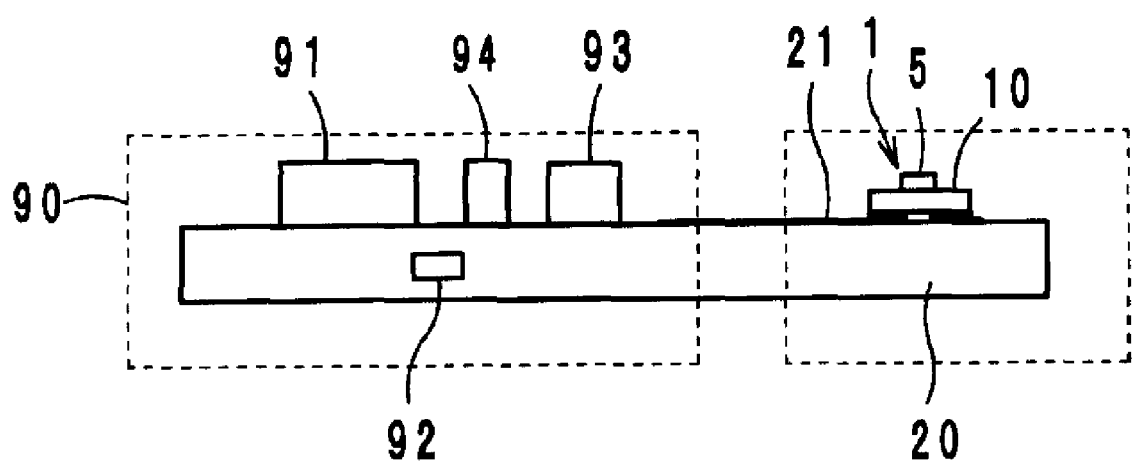
FIG. 18 is a diagram describing a printed circuit board included in the mobile telephone.

As illustrated in FIG. 18, in a casing 81, the printed circuit board 20 is disposed. On the printed circuit board 20, a radio communication circuit 90 and the electromagnetic coupling module 1 are disposed. The radio communication circuit 90 preferably includes an IC chip 91, a balun 92 included in the printed circuit board 20, a BPF 93, and a capacitor 94, for example. The power supply circuit board 10 on which the radio frequency IC chip 5 is mounted is disposed on a loop electrode (for example, the loop electrode 35 described in the sixth preferred embodiment or the loop electrode 36 described in the seventh preferred embodiment) coupled to the ground electrode 21 provided on the printed circuit board 20, whereby a radio frequency IC device is formed.

A radio frequency IC device according to the present invention and an electronic apparatus according to the present invention are not limited to the above-described preferred embodiments, and various changes can be made to the present invention without departing from the spirit and scope of the present invention.

For example, as an electrode for transmitting and receiving a high-frequency signal, not only a ground electrode but also various other electrodes disposed in or on a circuit board can be used. Furthermore, various types of resonance circuits can be used. A material for each of the outer electrode and the power supply circuit board which have been described in the above-described preferred embodiments is provided only as an example. Any suitable material having the required characteristics may be used. A power supply circuit board may also have a radio frequency IC chip function so as to define a radio frequency IC chip and a power supply circuit on a single substrate. In this case, the size and profile of a radio frequency IC device can be reduced.

In the first to fifth preferred embodiments, instead of a radio frequency IC chip, the electromagnetic coupling module 1 described in the sixth and seventh preferred embodiments may be used, for example.

In order to mount a radio frequency IC chip on a power supply circuit board, another method other than a method using a metal bump may be used. A dielectric may be disposed between the electrode of a radio frequency IC chip and the connection electrode of a power supply circuit board so as to provide the capacitive coupling between these electrodes, for example. Furthermore, the capacitive coupling between a radio frequency IC chip and a loop electrode or between a power supply circuit board and a loop electrode may be provided.

An apparatus including a radio frequency IC device is not limited to a radio frequency communication apparatus, such as a mobile telephone. Various apparatuses each provided with a circuit board including a ground electrode, for example, home electric appliances such as a television set and a refrigerator, may be used.

As described above, preferred embodiments of the present invention are useful for a radio frequency IC device including a radio frequency IC chip and an electronic apparatus including the radio frequency IC device, and, in particular, has an advantage of obtaining a reduction is size and easily achieving impedance matching without a dedicated antenna.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A radio frequency IC device comprising:
   a radio frequency IC chip arranged to process a transmitted signal and a received signal; and
   a printed circuit board including a ground electrode; wherein
   the ground electrode includes a cutout portion which is cut from an edge of the ground electrode and connection electrodes arranged to mount the radio frequency IC thereon, the cutout portion defines a loop electrode in the ground electrode, the connection electrodes are provided on opposed sides of the cutout portion, and the loop electrode provides an impedance matching function; and
   the radio frequency IC chip is mounted on the connection electrodes and arranged so as to extend across the cutout portion.

2. The radio frequency IC device according to claim 1, wherein the printed circuit board is a multilayer board including a plurality of dielectric layers and a plurality of magnetic layers that are laminated to one another.

3. The radio frequency IC device according to claim 2, wherein the loop electrode is provided on a main surface of the printed circuit board and is provided on at least one of the plurality of dielectric layers or on at least one of the plurality of magnetic layers.

4. The radio frequency IC device according to claim 1, wherein the printed circuit board includes a plurality of layers, and a plurality of the loop electrodes are respectively provided on the plurality of layers of the circuit board, and the loop electrode provided on at least one of the plurality of layers has a different loop size than the loop electrodes provided on the remaining layers of the plurality of layers.

5. The radio frequency IC device according to claim 4, wherein end portions of the loop electrode that has a different loop size are coupled to the radio frequency IC chip.

6. An electronic apparatus comprising the radio frequency IC device according to claim 1.

7. A radio frequency IC device comprising:
   an electromagnetic coupling module including a radio frequency IC arranged to process a transmitted signal and a received signal and a power supply circuit board including an inductance element coupled to the radio frequency IC;

a printed circuit board including a ground electrode; wherein the ground electrode includes a cutout portion which is cut from the edge of the ground electrode and connection electrodes arranged to mount the radio frequency IC thereon, the cutout portion defines a loop electrode in the ground electrode, the connection electrodes are provided on opposed sides of the cutout portion, and the loop electrode provides an impedance matching function; and the electromagnetic coupling module is mounted on the connection electrodes and arranged so as to extend across the cutout portion.

8. The radio frequency IC device according to claim 7, wherein a resonance circuit is provided in the power supply circuit board.

9. The radio frequency IC device according to claim 7, wherein a matching circuit is provided in the power supply circuit board.

10. The radio frequency IC device according to claim 7, wherein the printed circuit board is a multilayer board including a plurality of dielectric layers and a plurality of magnetic layers that are laminated to one another.

11. The radio frequency IC device according to claim 10, wherein the loop electrode is provided on a main surface of the printed circuit board and is provided on at least one of the plurality of dielectric layers or on at least one of the plurality of magnetic layers.

12. The radio frequency IC device according to claim 7, wherein the printed circuit board includes a plurality of layers, and a plurality of the loop electrodes are respectively provided on the plurality of layers of the circuit board, and the loop electrode provided on at least one of the plurality of layers has a different loop size than the loop electrodes provided on the remaining layers of the plurality of layers.

13. The radio frequency IC device according to claim 12, wherein end portions of the loop electrode that has a different loop size are coupled to one of the radio frequency IC chip and the electromagnetic coupling module.

14. The radio frequency IC device according to claim 7, wherein the power supply circuit board includes a multilayer board.

15. The radio frequency IC device according to claim 7, wherein the power supply circuit board includes a flexible board.

16. An electronic apparatus comprising the radio frequency IC device according to claim 7.

* * * * *